US012748138B2

(12) United States Patent
Jang et al.

(10) Patent No.: US 12,748,138 B2
(45) Date of Patent: Sep. 29, 2026

(54) PHASE DISCRIMINATOR FOR REFLECTED WAVES AND OPERATING METHOD THEREOF

(71) Applicant: Electronics and Telecommunications Research Institute, Daejeon (KR)

(72) Inventors: Seunghyun Jang, Daejeon (KR); Seok Bong Hyun, Daejeon (KR); Seung Hun Wang, Daejeon (KR); Jung Hwan Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 161 days.

(21) Appl. No.: 18/954,399

(22) Filed: Nov. 20, 2024

(65) Prior Publication Data

US 2025/0216430 A1 Jul. 3, 2025

(30) Foreign Application Priority Data

Dec. 28, 2023 (KR) ........................ 10-2023-0195199

(51) Int. Cl.
*G01R 27/06* (2006.01)

(52) U.S. Cl.
CPC .................................... *G01R 27/06* (2013.01)

(58) Field of Classification Search
USPC .......................................................... 324/612
See application file for complete search history.

(56) References Cited

U.S. PATENT DOCUMENTS

| | | | |
|---|---|---|---|
| 7,642,879 B2 | 1/2010 | Matsuno | |
| 11,387,078 B2 | 7/2022 | Morii | |
| 2017/0264010 A1 | 9/2017 | Shi | |
| 2020/0195283 A1* | 6/2020 | Lim | H04B 1/04 |
| 2022/0137209 A1 | 5/2022 | Alidio | |

FOREIGN PATENT DOCUMENTS

| | | |
|---|---|---|
| JP | 6324183 B2 | 5/2018 |
| KR | 10-0754780 B1 | 9/2007 |
| KR | 10-2018-0118215 A | 10/2018 |
| KR | 10-1905776 B1 | 10/2018 |
| KR | 10-2018-0130849 A | 12/2018 |

* cited by examiner

*Primary Examiner* — Farhana A Hoque
(74) *Attorney, Agent, or Firm* — BROADVIEW IP LAW, PC

(57) ABSTRACT

The present disclosure provides an apparatus and method of discriminating a phase of reflected waves. The apparatus includes a sensing impedance circuit disposed between a signal source and a load and having a variable sensing impedance, a directional coupler disposed between the signal source and the sensing impedance network, and a controller configured to detect intensities of an input signal transmitted from the signal source to the load and a reflected signal reflected from the load, determine a magnitude of the reflection coefficient based on the intensities of the signals, determine a difference in the magnitude of the reflection coefficient based on a plurality of magnitudes of the reflection coefficients obtained with respect to different sensing impedances, discriminate a range of the phase of the reflected waves based on the difference in the magnitude of the reflection coefficient, and control the sensing impedance network to change the sensing impedance.

20 Claims, 19 Drawing Sheets

D < 0.6

| | | |
|---|---|---|
| 0.489 | 0.323 | 0.275 |
| 0.211 | 0.046 | 0.064 |
| -0.155 | -0.024 | -0.003 |

D > 0.6

| | | |
|---|---|---|
| 0.743 | 0.885 | 0.859 |
| 0.921 | 1.212 | 1.122 |
| 2.564 | 2.013 | 1.424 |

| | | |
|---|---|---|
| -0.003 | -0.024 | -0.155 |
| 0.064 | 0.046 | 0.211 |
| 0.275 | 0.323 | 0.489 |

D < 0.6

| | | |
|---|---|---|
| 2.564 | 2.013 | 1.424 |
| 0.921 | 1.212 | 1.122 |
| 0.743 | 0.885 | 0.859 |

D > 0.6

PHASE DISCRIMINATOR FOR REFLECTED WAVES AND OPERATING METHOD THEREOF

CROSS-REFERENCE TO RELATED APPLICATION

The present application claims a convention priority under 35 U.S.C. § 119(a) based on Korean Patent Application No. 10-2023-0195199 filed on Dec. 28, 2023, the entire content of which is incorporated herein in its entirety by reference.

BACKGROUND

1. Technical Field

The present disclosure relates to a phase discriminator for reflected waves and an operating method thereof that may be utilized to compensate for impedance mismatch caused by reflected waves in wireless communications systems, etc.

2. Related Art

Most prior method for compensating for impedance mismatch use, a load impedance is matched to a characteristic impedance of a transmission line or an output impedance of a signal source by using a Smith chart. However, the use of the Smith chart may require a human intervention, and thus it may be difficult to automate the use of the Smith chart. Furthermore, it is difficult to apply the Smith chart when the load impedance is not known exactly.

In another method for compensating for the impedance mismatch, the impedance matching may be performed using various matching impedances by a variable impedance matching network between the signal source and the load, and a matching impedance minimizing the magnitude of the reflected signal may be determined among the various matching impedances. However, it may take a long time until the impedance matching is attained since the magnitude of the reflected signal is to be measured for various matching impedances available in the variable impedance matching network.

SUMMARY

To solve the above problems, the purpose of the present disclosure is to provide a phase discriminator for reflected waves and an operating method thereof that can simplify the structure and reduce power consumption by minimizing the additional circuitry required to directly measure a phase of the reflected waves.

Another purpose of the present disclosure is to provide a phase discriminator for reflected waves and an operating method thereof that can quickly find an impedance combination corresponding to the minimum reflection wave size by performing only impedance combinations of a specific region without performing all impedance combinations of a variable impedance matching network in an impedance matching system that performs impedance matching using only reflected wave size information.

According to an aspect of an exemplary embodiment, provided is a reflected wave phase discriminator for discriminating a range of a phase of reflected waves based on a magnitude of the reflection coefficient to compensate for an impedance mismatch between a signal source and a load. The reflected wave phase discriminator includes: a sensing impedance network disposed between the signal source and the load and comprising a sensing impedance circuit of which sensing impedance is variable; a directional coupler disposed between the signal source and the sensing impedance network; and a controller connected to the directional coupler and the sensing impedance network and configured to detect intensities of an input signal transmitted from the signal source to the load and a reflected signal reflected from the load, determine the magnitude of the reflection coefficient based on the intensities of the input signal and the reflected signal, determine a difference in the magnitude of the reflection coefficient based on a plurality of magnitudes of the reflection coefficients obtained with respect to different sensing impedances, discriminate the range of the phase of the reflected waves based on the difference in the magnitude of the reflection coefficient, and control the sensing impedance network to change the sensing impedance.

The sensing impedance network may include a parallel capacitor circuit, a series capacitor circuit, a series-parallel capacitor circuit, a parallel inductor circuit, a series inductor circuit, a series-parallel inductor circuit, a parallel resistor circuit, a series resistor circuit, a series-parallel resistor circuit, or a combination thereof.

The controller may discriminate the range of the phase of the reflected waves by use of a phase region discriminant expressed in a following equation:

$$D = \frac{|\Gamma|_{load} - |\Gamma|_{min}}{|\Gamma|_{load}^2}$$

where $|\Gamma|_{load}$ denotes the magnitude of a reflection coefficient caused by a load impedance of the load before a change in the sensing impedance, and $|\Gamma|_{min}$ denotes a second reflection coefficient which is a minimum of magnitudes of the reflection coefficients after the change in the sensing impedance when a resistive component of the sensing impedance of the sensing impedance circuit is changed contiguously.

The controller may compare a value of the phase region discriminant with a predetermined threshold to determine whether a point representing the reflection coefficient is positioned in a left half plane region or in a right half plane region of a Smith chart.

The controller may determine whether a point representing the reflection coefficient is positioned in a left half plane region or in a right half plane region of a Smith chart based on an increasing and/or decreasing pattern of the magnitude of the reflection coefficient according to a change in the sensing impedance when a resistive component of the sensing impedance of the sensing impedance circuit is changed contiguously.

The controller may determine whether a point representing the reflection coefficient is positioned in a upper half plane region or in a lower half plane region of a Smith chart based on an increasing and/or decreasing pattern of the magnitude of the reflection coefficient according to a change in a reactive component of the sensing impedance.

According to another aspect of an exemplary embodiment, provided is a reflected wave phase discriminator. The reflected wave phase discriminator includes: a sensing impedance network disposed immediately before a load and comprising a sensing impedance circuit of which sensing impedance is variable; a signal intensity detector configured to detect intensities of an input signal from a signal source to the load and a reflected signal reflected from the load; a reflection coefficient magnitude calculator configured to calculate a magnitude of a reflection coefficient based on the intensities of the input signal and the reflected signal; a sensing impedance selector configured to select the sensing impedance to a predetermined value according to the magnitude of the reflection coefficient to apply to the sensing impedance circuit; a reflected signal phase region discriminator configured to determine a difference in the magnitude of the reflection coefficient based on a plurality of magnitudes of the reflection coefficients obtained with respect to different sensing impedances and discriminate a range of a phase of the reflected waves based on the difference in the magnitude of the reflection coefficient; and an impedance controller configured to control the sensing impedance network to change the sensing impedance according to selection information from the sensing impedance selector.

The sensing impedance network may include a parallel capacitor circuit, a series capacitor circuit, a series-parallel capacitor circuit, a parallel inductor circuit, a series inductor circuit, a series-parallel inductor circuit, a parallel resistor circuit, a series resistor circuit, a series-parallel resistor circuit, or a combination thereof.

The reflected signal phase region discriminator may discriminate the range of the phase of the reflected waves by use of a phase region discriminant expressed in the above equation.

The reflected signal phase region discriminator may compare a value of the phase region discriminant with a predetermined threshold to determine whether a point representing the reflection coefficient is positioned in a left half plane region or in a right half plane region of a Smith chart.

The reflected signal phase region discriminator may determine whether a point representing the reflection coefficient is positioned in a left half plane region or in a right half plane region of a Smith chart based on an increasing and/or decreasing pattern of the magnitude of the reflection coefficient according to a change in the sensing impedance when a resistive component of the sensing impedance of the sensing impedance circuit is changed contiguously.

The reflected signal phase region discriminator may determine whether a point representing the reflection coefficient is positioned in a upper half plane region or in a lower half plane region of a Smith chart based on an increasing and/or decreasing pattern of the magnitude of the reflection coefficient according to a change in a reactive component of the sensing impedance.

The reflected wave phase discriminator may further include: a directional coupler disposed between the signal source and the sensing impedance network.

According to another aspect of an exemplary embodiment, provided is a method of discriminating a range of a phase of reflected waves based on a magnitude of the reflection coefficient to compensate for an impedance mismatch between a signal source and a load. The method includes: detecting intensities of an input signal transmitted from the signal source to the load and a reflected signal reflected from the load; determining the magnitude of the reflection coefficient based on the intensities of the input signal and the reflected signal; determining a difference in the magnitude of the reflection coefficient based on a plurality of magnitudes of the reflection coefficients obtained with respect to different sensing impedances; discriminating the range of the phase of the reflected waves based on the difference in the magnitude of the reflection coefficient; and controlling a sensing impedance network disposed between the signal source and the load to change a sensing impedance of the sensing impedance network.

The sensing impedance network may include a parallel capacitor circuit, a series capacitor circuit, a series-parallel capacitor circuit, a parallel inductor circuit, a series inductor circuit, a series-parallel inductor circuit, a parallel resistor circuit, a series resistor circuit, a series-parallel resistor circuit, or a combination thereof.

In the discriminating of the range of the phase of the reflected waves, the range of the phase may be discriminated by use of a phase region discriminant expressed in the above equation.

The operation of the discriminating of the range of the phase of the reflected waves may include: comparing a value of the phase region discriminant with a predetermined threshold; and determining whether a point representing the reflection coefficient is positioned in a left half plane region or in a right half plane region of a Smith chart according to a comparison result.

The operation of the discriminating of the range of the phase may include: identifying an increasing and/or decreasing pattern of the magnitude of the reflection coefficient according to a change in the sensing impedance when a resistive component of the sensing impedance of the sensing impedance circuit is changed contiguously; and determining whether a point representing the reflection coefficient is positioned in a left half plane region or in a right half plane region of a Smith chart according to an identification result.

The operation of the discriminating of the range of the phase may include: identifying an increasing and/or decreasing pattern of the magnitude of the reflection coefficient according to a change in a reactive component of the sensing impedance; and determining whether a point representing the reflection coefficient is positioned in a upper half plane region or in a lower half plane region of a Smith chart according to an identification result.

The operation of the discriminating of the range of the phase may include: identifying an increasing and/or decreasing pattern of the magnitude of the reflection coefficient according to a change in a reactive component of the sensing impedance; determining whether a point representing the reflection coefficient is positioned in a upper half plane region or in a lower half plane region of a Smith chart according to an identification result; and determining whether the point representing the reflection coefficient is positioned in a left half plane region or in a right half plane region of the Smith chart by use of a phase region discriminant expressed in the above equation.

An exemplary embodiment of the present disclosure may enable to estimate the range of the reflection coefficient by a reflected wave phase discriminator having a simple circuit structure for determining the phase of the reflected waves. Thus, an exemplary embodiment of the present disclosure may simplify the structure of the reflected wave phase discriminator and reduce a power consumption of the reflected wave phase discriminator.

According to an exemplary embodiment of the present disclosure, it is possible to reduce a number of attempts of the impedance matching when the load impedance is not known exactly by reducing a number of candidate load impedances to attempt the impedance matching within the region where the point representing the reflection coefficient is determined to be positioned rather than attempting the impedance matching with respect to all the candidate load impedances in the entire Smith chart and measuring an intensity of the reflected signal. That is, an exemplary embodiment of the present disclosure may enable to reduce the number of the candidate load impedances and the number of the attempts of the impedance matching, thereby allowing a rapid impedance matching.

In addition, according to an exemplary embodiment of the present disclosure, it is possible to determine a range of the phase of the reflected waves or a quadrant in the Smith chart where the point representing the reflection coefficient is positioned based on the magnitude of the reflection coefficient instead of directly acquiring the phase of the reflected waves, so that the impedance matching may be accomplished based on the magnitude of the reflection coefficient along with an estimated range of the phase of the reflected waves. Therefore an exemplary embodiment of the present disclosure may enable to simplify and miniaturize a hardware configuration for automating or computerizing the impedance matching and reduce the power consumption of the hardware.

In other words, an exemplary embodiment of the present disclosure may determine a range of the phase of the reflected waves or a quadrant in the Smith chart where the point representing the reflection coefficient is positioned based on the magnitude of the reflection coefficient, and utilize such information in the impedance matching. Accordingly, the impedance matching may be attempted only for the candidate load impedances represented by points in the quadrant. Thus, the impedance matching may be accomplished quickly.

According to an exemplary embodiment of the present disclosure, an impedance matching circuit provided in a same network as the sensing impedance network or separately from the sensing impedance network may perform the automatic impedance matching much quickly.

BRIEF DESCRIPTION OF THE DRAWINGS

In order that the disclosure may be well understood, there will now be described various forms thereof, given by way of example, reference being made to the accompanying drawings, in which.

Figure 1:
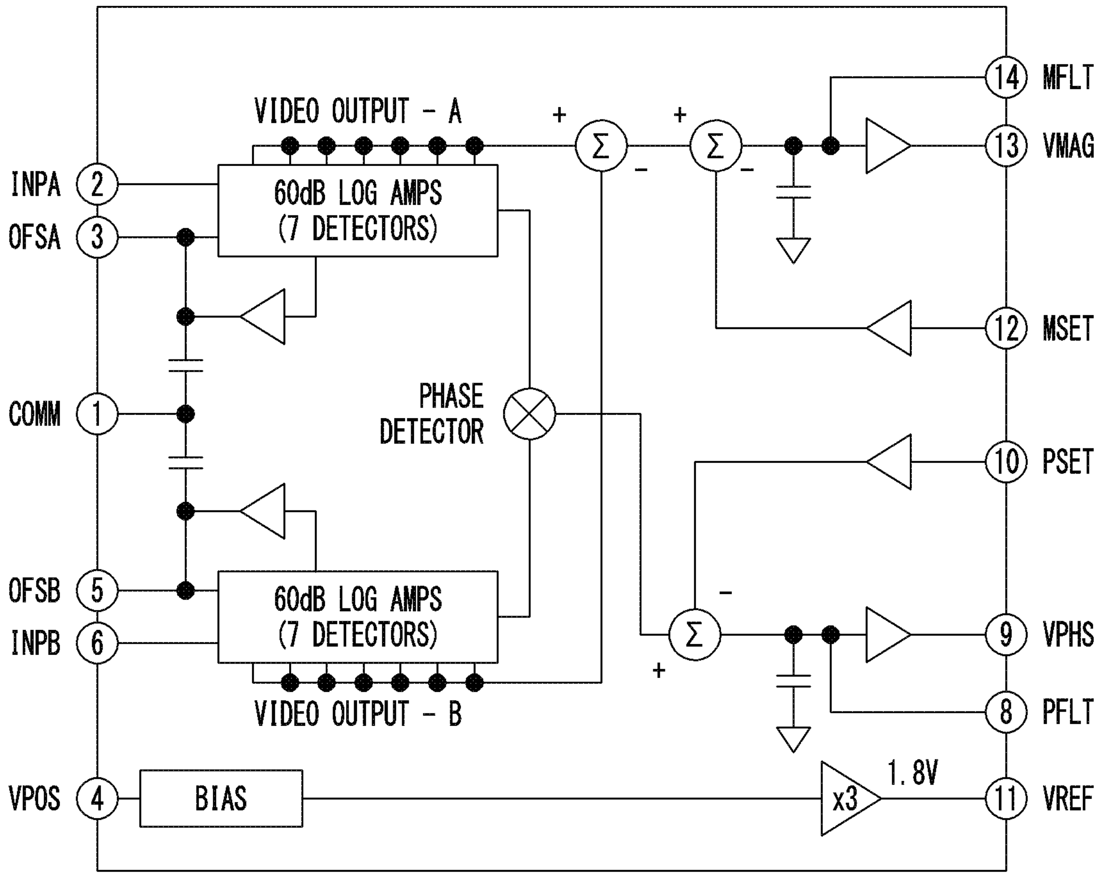
FIG. 1 shows an example of a conventional apparatus for detecting a magnitude and phase of reflected waves.

The drawings described herein are for illustration purposes only and are not intended to limit the scope of the present disclosure in any way.

DETAILED DESCRIPTION

For a clearer understanding of the features and advantages of the present disclosure, exemplary embodiments of the present disclosure will be described in detail with reference to the accompanied drawings. However, it should be understood that the present disclosure is not limited to particular embodiments disclosed herein but includes all modifications, equivalents, and alternatives falling within the spirit and scope of the present disclosure. In the drawings, similar or corresponding components may be designated by the same or similar reference numerals.

The terminologies including ordinals such as "first" and "second" designated for explaining various components in this specification are used to discriminate a component from the other ones but are not intended to be limiting to a specific component. For example, a second component may be referred to as a first component and, similarly, a first component may also be referred to as a second component without departing from the scope of the present disclosure. As used herein, the term "and/or" may include a presence of one or more of the associated listed items and any and all combinations of the listed items.

In the description of exemplary embodiments of the present disclosure, "at least one of A and B" may mean "at least one of A or B" or "at least one of combinations of one or more of A and B". In addition, in the description of exemplary embodiments of the present disclosure, "one or more of A and B" may mean "one or more of A or B" or "one or more of combinations of one or more of A and B".

When a component is referred to as being "connected" or "coupled" to another component, the component may be directly connected or coupled logically or physically to the other component or indirectly through an object therebetween. Contrarily, when a component is referred to as being "directly connected" or "directly coupled" to another component, it is to be understood that there is no intervening object between the components. Other words used to describe the relationship between elements should be interpreted in a similar fashion.

The terminologies are used herein for the purpose of describing particular exemplary embodiments only and are not intended to limit the present disclosure. The singular forms include plural referents as well unless the context clearly dictates otherwise. Also, the expressions "comprises," "includes," "constructed," "configured" are used to refer a presence of a combination of stated features, numbers, processing steps, operations, elements, or components, but are not intended to preclude a presence or addition of another feature, number, processing step, operation, element, or component.

Unless defined otherwise, all terms used herein, including technical or scientific terms, have the same meaning as commonly understood by those of ordinary skill in the art to which the present disclosure pertains. Terms such as those defined in a commonly used dictionary should be interpreted as having meanings consistent with their meanings in the context of related literatures and will not be interpreted as having ideal or excessively formal meanings unless explicitly defined in the present application.

Exemplary embodiments of the present disclosure will now be described in detail with reference to the accompanying drawings. In order to facilitate general understanding in describing the present disclosure, the same components in the drawings are denoted with the same reference signs, and repeated description thereof will be omitted. If the description of the conventional components may obscure the technical idea and concept of the present disclosure, however, detailed description of such components may be omitted for simplicity.

The present disclosure described hereinbelow relates to an apparatus and method for determining a region of a phase of a reflected waves based on a magnitude of the reflection coefficient and may be applied to various fields where a reflected signal may exist. However, the description in this specification is focused on a configuration for measuring the reflected signal generated between a signal source and a load and determining the region of the phase of the reflected waves. The signal source may include an amplifier and the load may include an antenna.

That is, the following detailed description focuses on an embodiment in which the signal source is an amplifier and the load is an antenna in a wireless communication system, but the present disclosure is not limited to such a configuration and can be applied to other technical fields in which impedance mismatch may occur.

First, the background of the present disclosure will now be described in terms of the reflected signal generated between the amplifier and the antenna of the wireless communications system.

An impedance mismatch between the amplifier and the antenna may reduce an amount of a transferred power and a signal transmission efficiency in the wireless communications system and needs to be compensated for because of following reasons.

First, if there exists an impedance mismatch in the wireless communications system, a power output by the power amplifier may not be transferred to the antenna in its maximum. Compensation for the impedance mismatch may minimize a power loss and optimize and improve an of a power transmission efficiency from the power amplifier to the antenna, which may enable to enlarge a communication range and improve a data transmission speed.

Second, the impedance mismatch may cause a reflection of some of the signal to be transferred to the antenna and a distortion of the signal provided by the amplifier. The compensation for the impedance mismatch may reduce the reflection of the signal and improve a signal quality.

Third, the impedance mismatch between the amplifier and the antenna may cause unwanted noise to be occurred.

Fourth, the impedance mismatch may make a matching between various components to become difficult and may reduce a stability and reliability of the system.

Therefore, the compensation for the impedance mismatch between the amplifier and the antenna may be an important process for optimizing the performance and improving the efficiency of the wireless communications system.

In a method for compensating for the impedance mismatch, a magnitude and phase of the reflected waves may be measured, and then an impedance matching network capable of compensating for the mismatch may be designed by use of a tool such as a Smith chart. A first thing to be carried out to perform the method may be the measurement of the magnitude and phase of the reflected wave.

FIG. 1 shows an comparative example of a device for detecting the magnitude and phase of the reflected waves. The device shown in FIG. 1 is an integrated circuit chip AD8302 provided by Analog Devices Inc.

Referring to FIG. 1, the device receives an input signal provided to a load such as the antenna and a reflected signal reflected from the load through pins No. 2 (INPA) and No. 6 (INPB), respectively. Then, the device obtains a phase difference between the input signal and the reflected signal by amplifying the input signal and the reflected signal, creating square wave signals from the amplified signals, and comparing two square wave signals by a phase detector. Such a device, however, may require a high gain internal amplifier to create the square wave signals from the input signal and the reflected signal. In addition, the internal amplifier may require an amplification bandwidth that is several times wider than bandwidths of the signals being amplified for the creation of the square wave signals and may consume lots of electric energy.

In another method for compensating for the impedance mismatch as another comparative example, the impedance matching is performed using various matching impedances configured in a variable impedance matching network disposed between the power amplifier and the antenna, and a matching impedance of the variable impedance matching network that minimizes the intensity of the reflected signal is selected among the various matching impedances. This method measures only the magnitudes of the signals and is simpler than the method measuring both the magnitudes and phases of the signals. Hence, this method needs to require a circuit having a simpler structure and may consume relatively low electrical energy because a wide bandwidth amplifier is not required. However, it takes a long time until the impedance matching is attained since the intensity of the reflected signal is to be measured for various matching impedances available in the variable impedance matching network.

However, the present disclosure provides an apparatus and method for measuring reflected waves with a simpler structure and in a relatively short time than the comparative examples to compensate the impedance mismatch. The apparatus for measuring the reflected waves may include a reflected wave phase discriminator, and the method for measuring the reflected waves may include a method of discriminating a phase of reflection waves or a method of operating a phase of reflected waves.

Figure 2:
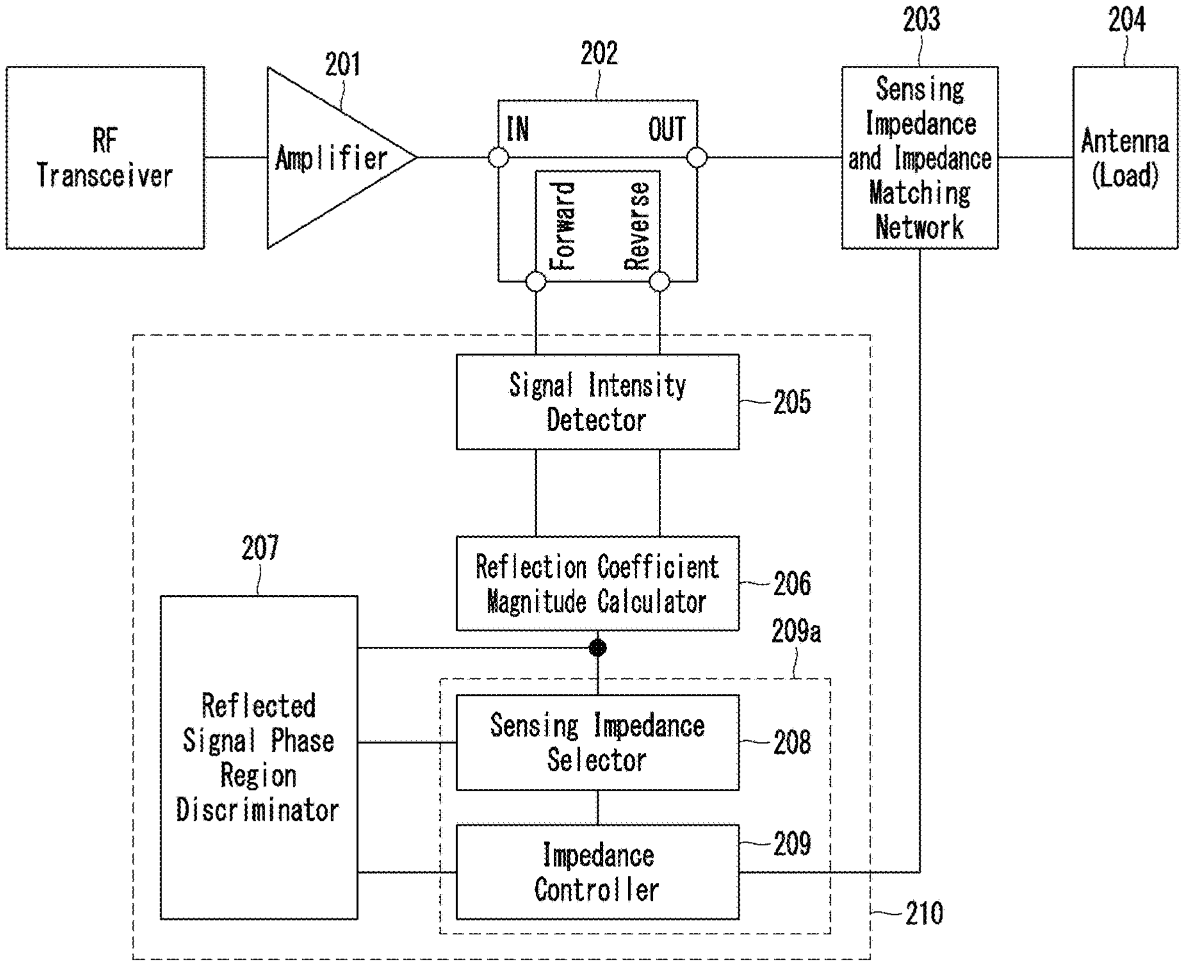
FIG. 2 is a block diagram of a communication apparatus equipped with a reflected wave phase discriminator according to an exemplary embodiment of the present disclosure.

FIG. 2 is a block diagram of a communication apparatus equipped with the reflected wave phase discriminator according to an exemplary embodiment of the present disclosure.

Referring to FIG. 2, the communication apparatus may include a radio frequency (RF) transceiver, an amplifier 201, a directional coupler 202, a controller 210, a sensing and matching impedance network 203, and a load 204. In the communication apparatus, the directional coupler 202 and the controller 210 constitute the reflected wave phase discriminator according to an exemplary embodiment of the present disclosure. The sensing and matching impedance network 203 may be a component extending a conventional impedance matching circuit and may be considered a part of the reflected wave phase discriminator in a broad sense.

According to the present disclosure, a range of a phase of reflected waves associated with a reflection of the signal from the load 204 or a region where a load impedance of the load 204 is positioned on the Smith chart may be determined easily based only on a magnitude of the reflection coefficient. Further, according to an exemplary embodiment of the present disclosure, an impedance matching may simply be accomplished based on the phase range of the reflected waves determined as above in addition to the magnitude of the reflection coefficient.

The RF transceiver may include an RF transmitter circuit and an RF receiver circuit, or may include an RF transceiver circuit in which the RF transmitter circuit and the RF receiver circuit are integrated. The RF transmitter circuit may be implemented with a microcontroller providing the RF transmitter circuit with data to be transmitted to a counterpart communication apparatus. The RF receiver circuit may receive a modulated RF signal and demodulate the modulated RF signal, may include a superheterodyne receiver or a super-regenerative receiver, and may further include a low noise amplifier.

The amplifier 201 may be electrically coupled to the RF transceiver. The amplifier 201 may receive an RF transmit signal from the RF transceiver to amplify the RF transmit signal and output an amplified RF transmit signal. In a process of discriminating the phase of the reflected wave and performing the impedance matching according to the present disclosure, the amplified RF transmit signal acts as an input signal applied to the load 204 through the sensing and matching impedance network 203. While the amplifier 201 may be installed as a separate unit from the RF transceiver, the amplifier 201 may be provided in a form integrally connected to the RF transmitter circuit of the RF transceiver.

The directional coupler 202 is disposed between the amplifier 201 and the load 204 and allows the controller 210 to be coupled to a signal path between the amplifier 201 and the load 204. In particular, the directional coupler 202 allows the controller 210 to be coupled to the transmission path independently for a forward and a reverse signal paths. That is, the directional coupler 202 extracts a portion of the amplified RF transmit signal output by the amplifier 201 to provide to the controller 210 while separately extracting a portion of the reflected signal caused by a reflection of the amplified RF transmit signal by the load 204 and/or the sensing and matching impedance network 203 and propagating to the source, i.e., the amplifier 201, to provide to the controller 210.

The sensing and matching impedance network 203 may be disposed between the directional coupler 202 and the load 204, that is, at a front end of the load 204. In an exemplary embodiment, the sensing and matching impedance network 203 may include a sensing impedance circuit and an impedance matching circuit. The sensing impedance circuit is a network for temporarily changing an impedance seen from a source side, i.e. an impedance looking into a combination of the sensing and matching impedance network 203 and the load from an output terminal of the amplifier 201 neglecting an impedance of the directional coupler 202 in order to allow the controller 210 to obtain a plurality of reflection coefficients corresponding to respective impedances seen from the source side during a process of determining the phase range of the reflected waves or the region where the load impedance is positioned on the Smith chart based on the magnitudes of the plurality of reflection coefficients. The impedance matching circuit is a network for matching the load impedance to an output impedance of the amplifier 201. Alternatively, however, the sensing and matching impedance network 203 may include only the sensing impedance circuit without the impedance matching circuit. In such a case, the impedance matching circuit may be provided separately in the communication apparatus.

Each of the sensing impedance circuit and the impedance matching circuit may include at least one capacitor, and/or at least one inductor, and/or at least one resistor, and/or at least one switch. The at least one switch may be turned on or off in response to a control signal from the controller 210 to activate or deactivate the at least one capacitor, and/or the at least one inductor, and/or the at least one resistor. Here, an activation of a circuit element may mean electrically connecting the circuit element to another circuit element, and a deactivation of the circuit element may mean electrically disconnecting the circuit element from the other circuit element. Accordingly, the impedance of each of the sensing impedance circuit and the impedance matching circuit may be variable.

The term "sensing impedance" used herein refers to an impedance selectively added before the load 204 to change an impedance seen from the source side from a first impedance being the same as the load impedance, for example, to a second impedance being the same as a total impedance of a combination of the sensing impedance and the load impedance. As described in detail below, the sensing impedance may be determined and set by the controller 210, which may acquire a magnitude of a first reflection coefficient corresponding to the first impedance while acquiring a magnitude of a second reflection coefficient corresponding to the second impedance. Therefore, the impedance seen from the source side may change from the first impedance to the second impedance after the sensing impedance is added or changed.

The load 204 may be an antenna for radiating an electromagnetic wave corresponding to the amplified RF transmit signal. The term "load impedance" used herein refers to the impedance of load 204 as mentioned above.

The controller 210 may determine the magnitude of the reflection coefficient based on the input signal, i.e., the amplified RF transmit signal output by the amplifier 201, and the reflected signal, both of which are detected through the directional coupler 202. In particular, the controller 210 may determine the magnitude of a first reflection coefficient when no sensing impedance is added or a first sensing impedance is set in the sensing and matching impedance network 203 and determine the magnitude of a second reflection coefficient when the sensing impedance is added or a second sensing impedance is set in the sensing and matching impedance network 203. In addition, the controller 210 may determine the phase range of the first reflection coefficient or the region where the load impedance is positioned on the Smith chart based on the magnitudes of the first and second of reflection coefficients. The directional coupler 202 may be construed to be included in the controller 210 in a broad sense.

During this operation, the controller 210 may control the sensing and matching impedance network 203 to change the sensing impedance by providing the sensing and matching impedance network 203 with a control signal for turning on or off the at least one switch in the sensing and matching impedance network 203.

The controller 210 may include a signal intensity detector 205, a reflection coefficient magnitude calculator 206, a reflected signal phase region discriminator 207, a sensing impedance selector 208, and an impedance controller 209.

At least one of the components of the controller 210 may be implemented by program instructions or a software module.

The signal intensity detector 205 may detect an intensity of the input signal, that is, the amplified RF transmit signal output by the amplifier 201 to the load 203. In addition, the signal intensity detector 205 may detect an intensity of the reflected signal which is a portion of the amplified RF transmit signal reflected from the load 203 and propagating toward the amplifier 201. In an exemplary embodiment, the signal intensity detector 205 may determine the intensities of the amplified RF transmit signal and the reflected signal based on the signals extracted by the directional coupler 202. However, the present disclosure is not limited thereto, and the signal intensity detector 205 may acquire the amplified RF transmit signal and the reflected signal using another configuration performing the same or similar function as the directional coupler 202.

The reflection coefficient magnitude calculator 206 may calculate the magnitude of the reflection coefficient by using the intensities of the amplified RF transmit signal and the reflected signal acquired by the signal intensity detector 205. For example, the reflection coefficient magnitude calculator 206 may calculate the magnitude of the reflection coefficient by dividing the intensity of the reflected signal by the intensity of the amplified RF transmit signal. In particular, the reflection coefficient magnitude calculator 206 may calculate the magnitude of the first reflection coefficient by using the intensities of the amplified RF transmit signal and the reflected signal acquired when the impedance seen from the source side is equal to the first impedance. In addition, the reflection coefficient magnitude calculator 206 may calculate the magnitude of the second reflection coefficient by using the intensities of the amplified RF transmit signal and the reflected signal acquired when the impedance seen from the source side is equal to the second impedance.

The reflected signal phase region discriminator 207 may sequentially receive the plurality of reflection coefficient magnitudes from the reflection coefficient magnitude calculator 206. For example, the reflected signal phase region discriminator 207 may receive the magnitude of the first reflection coefficient which is determined when the sensing impedance is zero and the impedance seen from the source side is equal to the first impedance, and then may receive the magnitude of the second reflection coefficient which is determined when the sensing impedance is added to have a non-zero value and the impedance seen from the source side is equal to the second impedance. The reflected signal phase region discriminator 207 may determine a change pattern of the reflection coefficient magnitudes. For example, the reflected signal phase region discriminator 207 may determine a difference between the magnitude of the first reflection coefficient and the magnitude of the second reflection coefficient as the change pattern. In addition, the reflected signal phase region discriminator 207 may determine the region where the load impedance is positioned on the Smith chart based on the change pattern of the magnitudes of the plurality of reflection coefficients.

The sensing impedance selector 208 may determine the sensing impedance to be applied to the determination of the magnitude of a next reflection coefficient (e.g., the second reflection coefficient). In an exemplary embodiment, the sensing impedance selector 208 may receive the magnitude of the first reflection coefficient from the reflection coefficient magnitude calculator 206 and determine the sensing impedance to be applied to the determination of the magnitude of the second reflection coefficient according to the magnitude of the first reflection coefficient. The sensing impedance selector 208 may be equipped with information on a set of applicable sensing impedances according to a configuration of the sensing impedance circuit of the sensing and matching impedance network 203, and may select one of the sensing impedances belonging to the set according to the magnitude of the first reflection coefficient.

The impedance controller 209 may receive sensing impedance-related information from the sensing impedance selector 208 and output a control signal for causing a change in a switching state of each switch in the sensing impedance circuit of the sensing and matching impedance network 203. The sensing impedance-related information may include configuration information of the sensing impedance circuit or an on/off state of each switch in the sensing impedance circuit that corresponds to the sensing impedance determined by the sensing impedance selector 208. As a result, the impedance controller 209 may cause a change in the configuration of the sensing impedance circuit of the sensing and matching impedance network 203 or an activation or deactivation of the sensing impedance circuit by changing the switching state of each switch in the sensing impedance circuit.

Further, after the region where the load impedance is positioned on the Smith chart is determined, the impedance controller 209 may provide the impedance matching circuit in the sensing and matching impedance network 203 with a control signal for accomplishing the impedance matching based on the magnitude of the reflection coefficient as well as the phase range of the reflected waves estimated by the region where the load impedance is positioned on the Smith chart.

Meanwhile, the sensing impedance selector 208 and the impedance controller 209 may be integrated into a single component or module performing the functions of the two components described above.

The operation of the reflected wave phase discriminator according to an exemplary embodiment of the present disclosure will now be described in detail.

Figure 3:
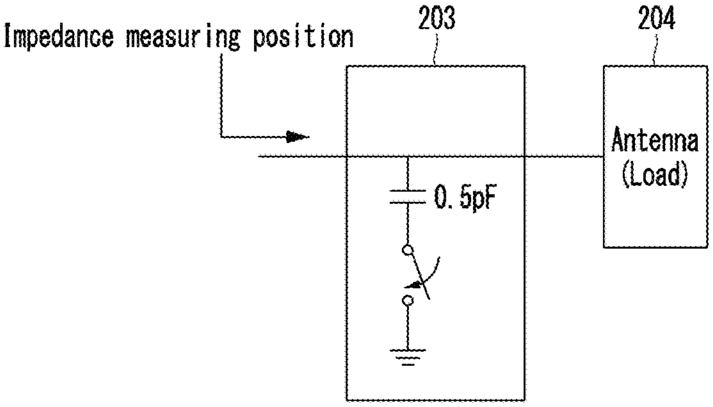
FIG. 3 is a block diagram of an exemplary embodiment of a sensing and matching impedance network shown in FIG. 2.
Figure 4:
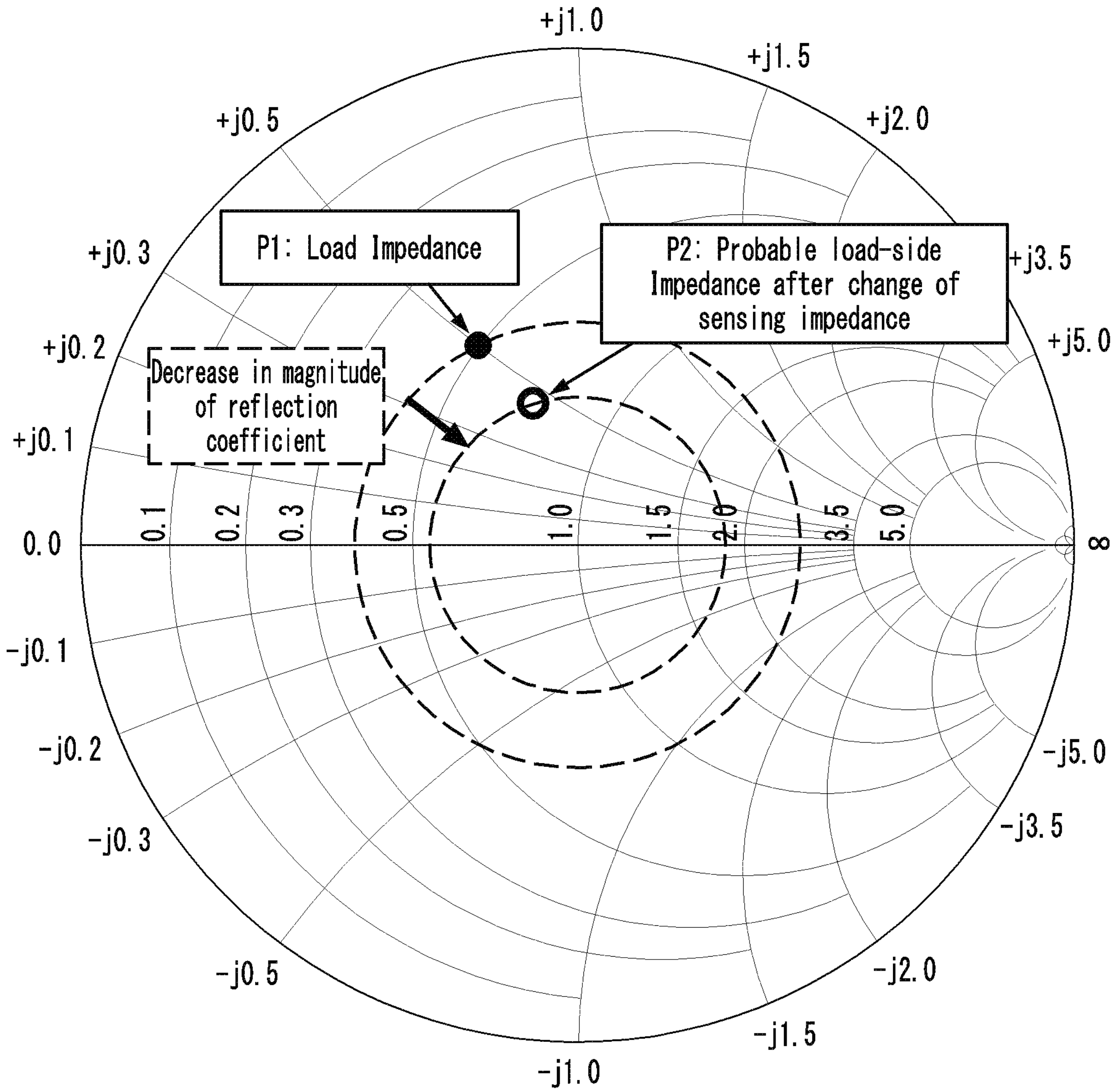
FIG. 4 is a Smith chart for explaining a first example of an operation of a reflected wave phase discriminator according to the embodiment of FIG. 3.

FIG. 3 is a block diagram of an exemplary embodiment of the sensing and matching impedance network 203, and FIG. 4 is a Smith chart for explaining a first example of the operation of the reflected wave phase discriminator according to the embodiment of FIG. 3.

Referring to FIG. 3, the sensing and matching impedance network 203 may include the sensing impedance circuit without the impedance matching circuit, and the sensing impedance circuit includes a capacitor and a switch. For convenience of description, the load 204 is also shown in FIG. 3.

The switch in the sensing and matching impedance network 203 may be switched in response to the control signal from the controller 210 to change the sensing impedance from zero to a reactance of the capacitor. In the present embodiment, the controller 210 of the reflected wave phase discriminator may determine whether the phase of the first reflection coefficient is in a range between zero degree and 180 degrees and a point representing the load impedance is in a upper half plane region of the Smith chart or the phase of the first reflection coefficient is in a range between 180 degrees and 360 degrees and the point representing the load impedance is in a lower half plane region of the Smith chart. For a detailed description of the exemplary operation, it is assumed that the characteristic impedance or output impedance of the amplifier 201 is 50Ω (ohms) and the load impedance is 25+j25Ω at a working frequency of 2.4 Gigahertz (GHz).

In this example, the load impedance of 25+j25Ω is plotted at a point P1 where a constant resistance circle of R=0.5 intersects a constant reactance curve of Z=j0.5. In a state that the switch in the sensing and matching impedance network 203 is turned off, the impedance seen from the source side is unchanged from the load impedance because the sensing impedance is zero. At this time, the magnitude of the reflection coefficient is the same as a radius of a circle centered at a center of the chart and passing the point P1 representing the load impedance, which circle may be plotted by an outer dashed circle in FIG. 4.

The signal intensity detector 205 may determine the intensity of the input signal, that is, the amplified RF transmit signal along with the intensity of the reflected signal and output the intensities of the amplified RF transmit signal and the reflected signal to the reflection coefficient magnitude calculator 206. The reflection coefficient magnitude calculator 206 may calculate the magnitude of the first reflection coefficient based on the intensities of the amplified RF transmit signal and the reflected signal and output the magnitude of the first reflection coefficient to the reflected signal phase region discriminator 207 and the sensing impedance selector 208. The sensing impedance selector 208 may determine the sensing impedance to be applied to the determination of the magnitude of the second reflection coefficient based on the magnitude of the first reflection coefficient. At this time, the sensing impedance may be determined to be 0.5 picofarad (pF), for example. In an actual implementation, the sensing impedance circuit in the sensing and matching impedance network 203 may include a plurality of circuit elements that can be interconnected with each other (e.g., a plurality of capacitors having different capacitances that may be connected in parallel selectively), but just a single capacitor having the capacitance of 0.5 pF is illustrated in FIG. 4 for simplicity under an assumption that the capacitor of the size is suitable for the calculated first reflection coefficient.

Then, the impedance controller 209 may output the control signal to the sensing impedance circuit of the sensing and matching impedance network 203 to control the sensing impedance circuit such that the sensing impedance of the sensing impedance circuit is set to the impedance determined by the sensing impedance selector 208. The sensing impedance cause the impedance seen from the source side to be changed into the second impedance from the first impedance, which in turn changes the intensity of the reflected signal. The signal intensity detector 205 may determine the intensity of the reflected signal, and the reflection coefficient magnitude calculator 206 may calculate the magnitude of the second reflection coefficient based on the intensities of the amplified RF transmit signal and the reflected signal after the change of the sensing impedance. The reflected signal phase region discriminator 207 may compare the magnitude of the first reflection coefficient obtained before the change of the sensing impedance with the magnitude of the second reflection coefficient obtained after the change of the sensing impedance. At this time, even if the load impedance is not known exactly, the reflected signal phase region discriminator 207 may determine that the phase of the first reflection coefficient is in the range between zero degree and 180 degrees and the point P1 representing the load impedance is in the upper half plane region of the chart, referred to as an inductive region, based on the fact that the difference between the magnitudes of the second and first reflection coefficients is negative, i.e., the magnitude of the reflection coefficient has decreased.

A principle of the determination may be described in a qualitative point of view is as follows. An addition of a capacitor in shunt as the sensing impedance to the load always rotates the point representing the impedance in the clockwise direction downwards along a constant conductance circle and moves the point toward a capacitive region on the chart. If the downward movement of the point after the addition of the capacitor has resulted in a decrease in the magnitude of the reflection coefficient represented by a distance from the center of the chart, it can be said that the point P1 representing the load impedance before the addition of the sensing impedance was in the inductive region of the chart.

Figure 5:
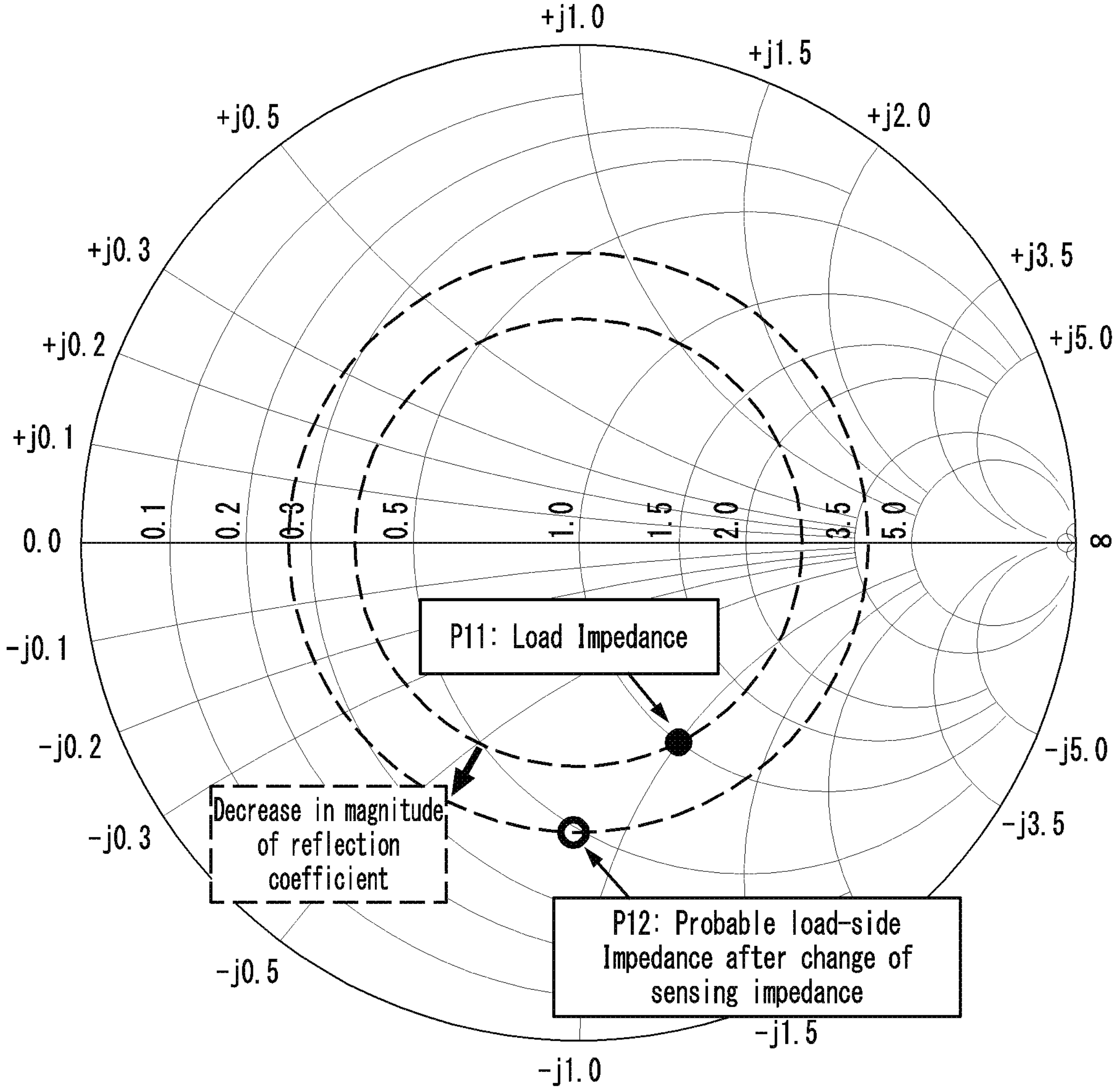
FIG. 5 is the Smith chart for explaining a second example of the operation of the reflected wave phase discriminator according to the embodiment of FIG. 3.

FIG. 5 is a Smith chart for explaining a second example of the operation of the reflected wave phase discriminator according to the embodiment of FIG. 3.

Referring to FIG. 5, the controller 210 of the reflected wave phase discriminator according to the present embodiment may determine whether the phase of the first reflection coefficient is in the range between zero degree and 180 degrees and the point P11 representing the load impedance is in the upper half plane region of the Smith chart or the phase of the first reflection coefficient is in the range between 180 degrees and 360 degrees and the point P11 representing the load impedance is in the lower half plane region of the Smith chart. In the example shown in FIG. 5, it is assumed that the characteristic impedance or the output impedance of the amplifier 201 is 50Ω and the load impedance is 50−j50Ω at a working frequency of 2.4 GHz.

In this example, the load impedance of 50−j50Ω is plotted at a point P11 where a constant resistance circle of R=1.0 intersects a constant reactance curve of Z=−j1.0. In a state that the switch in the sensing and matching impedance network 203 is turned off, the impedance seen from the source side is unchanged from the load impedance because the sensing impedance is zero. At this time, the magnitude of the reflection coefficient is the same as a radius of a circle centered at a center of the chart and passing the point P11 representing the load impedance, which circle may be plotted by an inner dashed circle in FIG. 5.

The signal intensity detector 205 may determine the intensity of the input signal, that is, the amplified RF transmit signal along with the intensity of the reflected signal and output the intensities of the amplified RF transmit signal and the reflected signal to the reflection coefficient magnitude calculator 206. The reflection coefficient magnitude calculator 206 may calculate the magnitude of the first reflection coefficient based on the intensities of the amplified RF transmit signal and the reflected signal and output the magnitude of the first reflection coefficient to the reflected signal phase region discriminator 207 and the sensing impedance selector 208. The sensing impedance selector 208 may determine the sensing impedance to be applied to the determination of the magnitude of the second reflection coefficient based on the magnitude of the first reflection coefficient. At this time, the sensing impedance may be determined to be 0.5 pF, for example. As mentioned above, the sensing impedance circuit in the sensing and matching impedance network 203 may include a plurality of capacitors having different capacitances and being connected in parallel selectively, but just a single capacitor having the capacitance of 0.5 pF may be used under an assumption that the capacitor of the size is suitable for the calculated first reflection coefficient.

Then, the impedance controller 209 may output the control signal to the sensing impedance circuit of the sensing and matching impedance network 203 to control the sensing impedance circuit such that the sensing impedance of the sensing impedance circuit is set to the impedance determined by the sensing impedance selector 208. The sensing impedance cause the impedance seen from the source side to be changed into the second impedance from the first impedance, which in turn changes the intensity of the reflected signal. The signal intensity detector 205 may determine the intensity of the reflected signal, and the reflection coefficient magnitude calculator 206 may calculate the magnitude of the second reflection coefficient based on the intensities of the amplified RF transmit signal and the reflected signal after the change of the sensing impedance. The reflected signal phase region discriminator 207 may compare the magnitude of the first reflection coefficient obtained before the change of the sensing impedance with the magnitude of the second reflection coefficient obtained after the change of the sensing impedance. At this time, even if the load impedance is not known exactly, the reflected signal phase region discriminator 207 may determine that the phase of the first reflection coefficient is in the range between 180 degrees and 360 degrees and the point P11 representing the load impedance is in the lower half plane region of the chart, referred to as a capacitive region, based on the fact that the difference between the magnitudes of the second and first reflection coefficients is positive, i.e., the magnitude of the reflection coefficient has increased.

The principle of the determination may be described in a qualitative point of view is as follows. An addition of a capacitor in shunt as the sensing impedance to the load always rotates the point representing the impedance in the clockwise direction downwards along a constant conductance circle and moves the point downwards on the chart. If the downward movement of the point after the addition of the capacitor has resulted in an increase in the magnitude of the reflection coefficient represented by the distance from the center of the chart, it can be said that the point P11 representing the load impedance before the addition of the sensing impedance was in the capacitive region of the chart.

Figure 6:
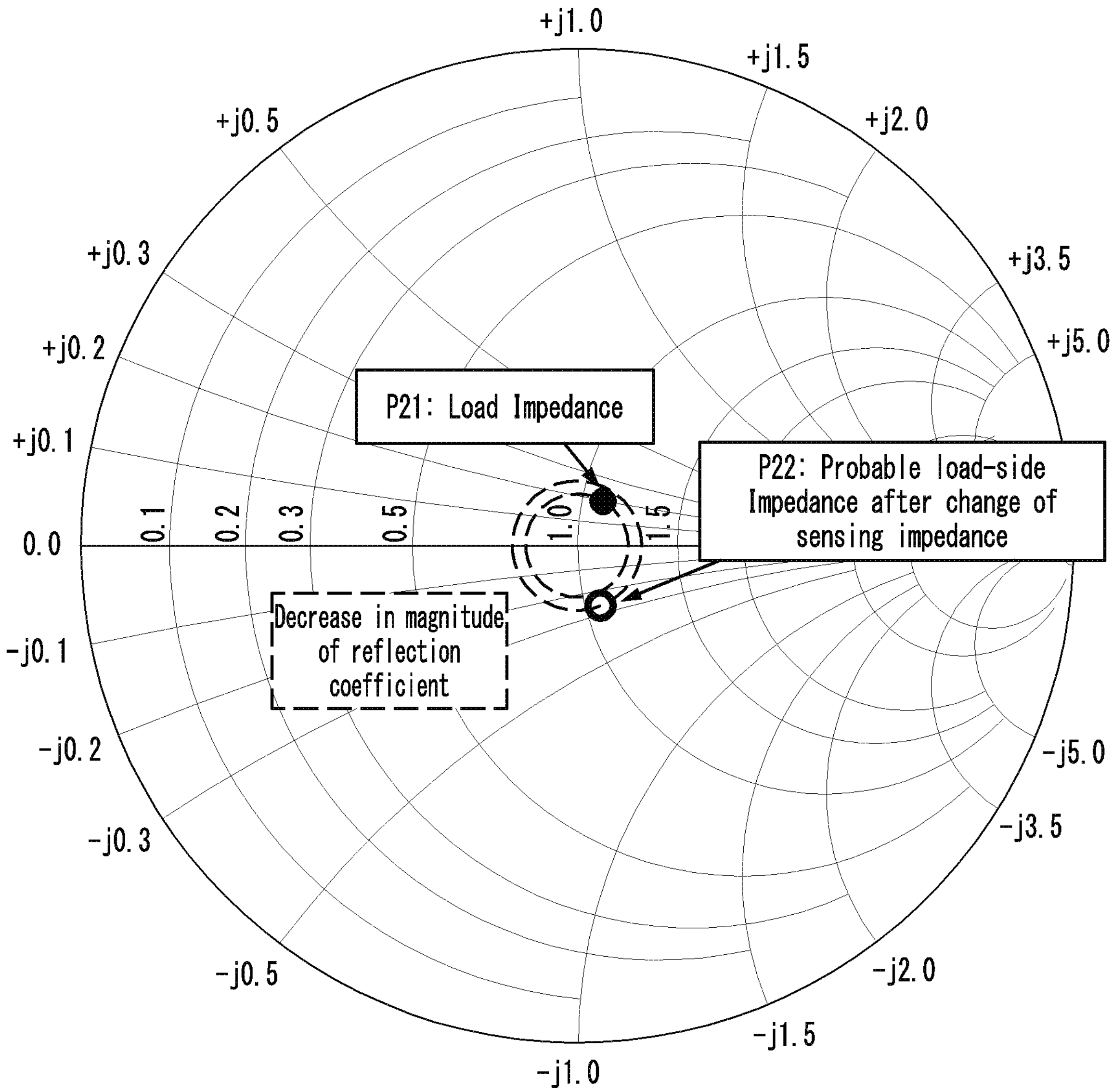
FIG. 6 is the Smith chart for explaining a third example of the operation of the reflected wave phase discriminator according to the embodiment of FIG. 3.

FIG. 6 is a Smith chart for explaining a third example of the operation of the reflected wave phase discriminator according to the embodiment of FIG. 3.

Referring to FIG. 6, the controller 210 of the reflected wave phase discriminator according to the present embodiment may determine whether the phase of the first reflection coefficient is in the range between zero degree and 180 degrees and the point P21 representing the load impedance is in the upper half plane region of the Smith chart or the phase of the first reflection coefficient is in the range between 180 degrees and 360 degrees and the point P21 representing the load impedance is in the lower half plane region of the Smith chart. In the example shown in FIG. 6, it is assumed that the characteristic impedance or the output impedance of the amplifier 201 is 50Ω and the load impedance is 50+j10Ω at a working frequency of 2.4 GHz.

In this example, the load impedance of 50+j10Ω is plotted at a point P21 where a constant resistance circle of R=1.0 intersects a constant reactance curve of Z=j0.2. Since a difference between the characteristic impedance of 50Ω and the load impedance of 50+j10Ω is small and the impedance mismatch is not large, the magnitude of the reflection coefficient represented by the radius of an inner dashed circle in FIG. 6 is small. In this situation, if a capacitor with a large capacitance (e.g., 0.5 pF used in FIGS. 4 and 5) is used for the sensing impedance, the magnitude of the reflection coefficient may become larger, as shown by an outer dashed circle in FIG. 6, after the change in the sensing impedance than before the change in the sensing impedance. That is, the capacitor used as the sensing impedance and having an excessively large capacitance compared with an impedance mismatch level may move the point P21 representing the load impedance downwards by an excessive amount. As a result, the reflected signal phase region discriminator 207 may incorrectly determine that the point P21 representing the load impedance is in the lower half plane region of the chart as in the case of FIG. 5 even though the point P21 representing the load impedance is actually in the upper half plane region of the chart as in the case of FIG. 4. Therefore, the controller 210 may be configured to vary the capacitance of the capacitor in the sensing impedance circuit to a smaller value according to the magnitude of the first reflection coefficient when the magnitude of the first reflection coefficient is small.

Above-described operating principle or a rule or policy corresponding to the operating principle may be applied by the sensing impedance selector 208 which determines the sensing impedance based on the magnitudes of the reflection coefficients. Alternatively, however, the operating principle or the rule or policy corresponding to the operating principle may be applied by the impedance controller 209 which generates and outputs the control signal for changing the configuration of the sensing impedance circuit of the sensing and matching impedance network 203 based on the sensing impedance-related information from the sensing impedance selector 208. In this case, the impedance controller 209 may be configured to designate the switching state of each switch in the sensing impedance circuit or adjust or lower the level or intensity of the control signal in order to apply the above-described rule or policy.

Figure 7:
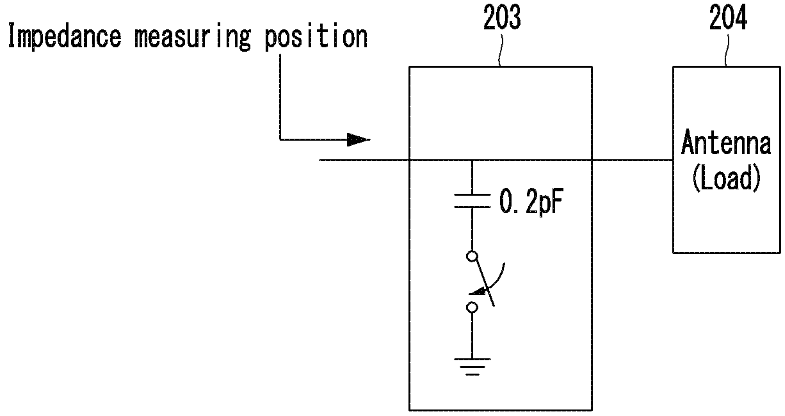
FIG. 7 is a block diagram of another exemplary embodiment of the sensing and matching impedance network.
Figure 8:
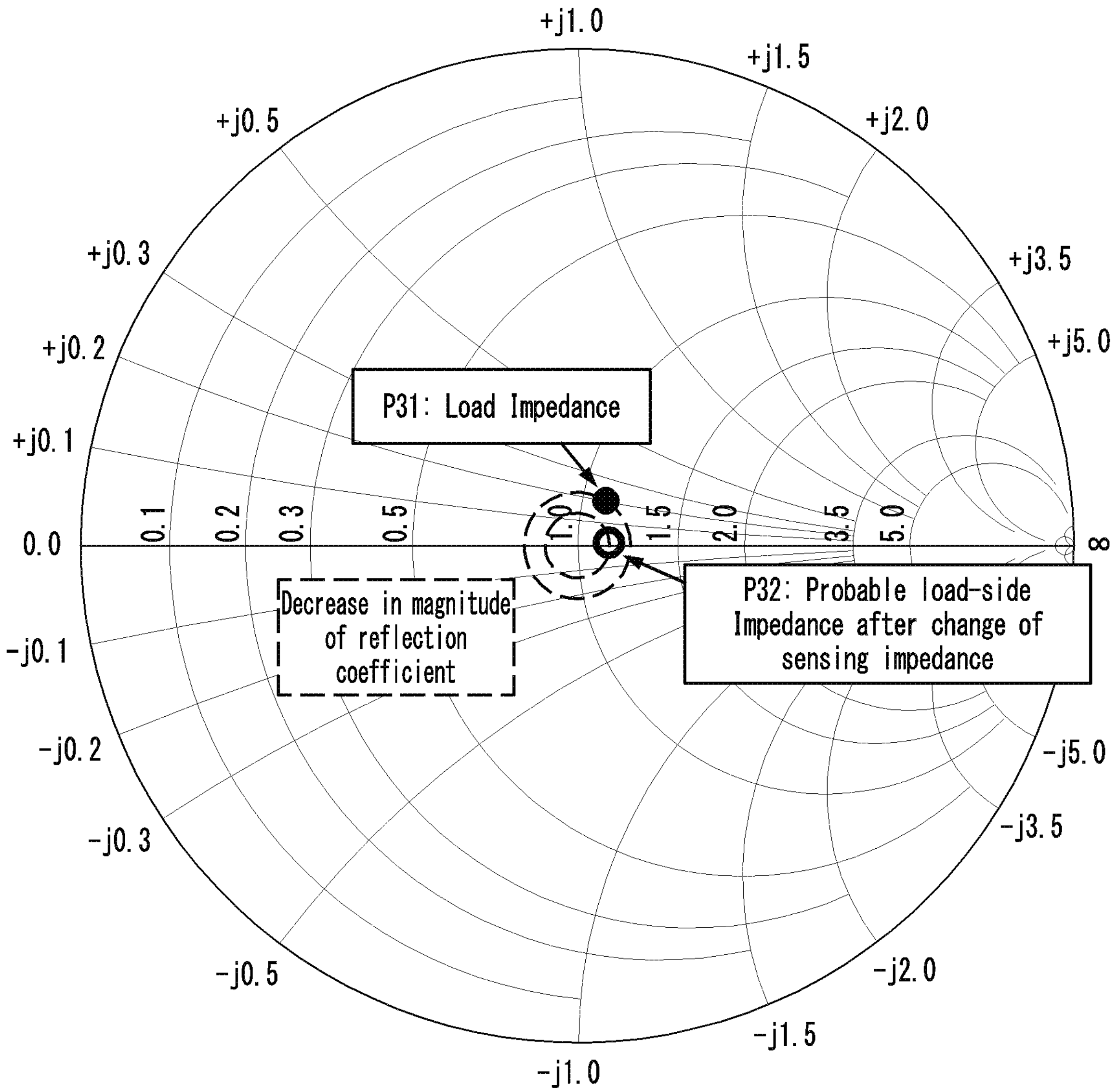
FIG. 8 is the Smith chart for explaining an example of the operation of the reflected wave phase discriminator according to the embodiment of FIG. 7.

FIG. 7 is a block diagram of another exemplary embodiment of the sensing and matching impedance network 203, and FIG. 8 is a Smith chart for explaining an example of the operation of the reflected wave phase discriminator according to the embodiment of FIG. 7. The sensing and matching impedance network 203 shown in FIG. 7 is similar to the network shown in FIG. 3 but may be implemented using a capacitor with a smaller capacitance than that used in the network of FIG. 3. For convenience of description, the load 204 is also shown in FIG. 7.

Referring to FIG. 7, the switch in the sensing and matching impedance network 203 may be switched in response to the control signal from the controller 210 to change the sensing impedance from zero to the reactance of the capacitor. In the present embodiment, the controller 210 may determine whether the phase of the first reflection coefficient is in the range between zero degree and 180 degrees and the point P31 representing the load impedance is in the upper half plane region of the Smith chart or the phase of the first reflection coefficient is in the range between 180 degrees and 360 degrees and the point P31 representing the load impedance is in the lower half plane region of the Smith chart. In the example shown in FIG. 8, it is assumed that the characteristic impedance or output impedance of the amplifier 201 is 50Ω and the load impedance is 25+j25Ω at a working frequency of 2.4 GHz.

In this example, the load impedance of 50+j10Ω is plotted at a point P31 where a constant resistance circle of R=1.0 intersects a constant reactance curve of Z=j0.2. Since the difference between the characteristic impedance of 50Ω and the load impedance of 50+j10Ω is small and the impedance mismatch is not large, the magnitude of the reflection coefficient represented by the radius of an outer dashed circle in FIG. 8 is small. In this situation, if a capacitor with a small capacitance (e.g., 0.2 pF) is used for the sensing impedance, the magnitude of the reflection coefficient may become smaller, as shown by an inner dashed circle in FIG. 8, after the change in the sensing impedance than before the change in the sensing impedance.

Since the magnitude of the reflection coefficient after the change in the sensing impedance is smaller than the magnitude of the reflection coefficient before the change in the sensing impedance, the reflected signal phase region discriminator 207 or the reflected wave phase discriminator including the region discriminator 207 may correctly determine that the point P31 representing the load impedance is in the inductive region of the Smith chart, i.e., the upper half plane region of the chart.

Figure 9:
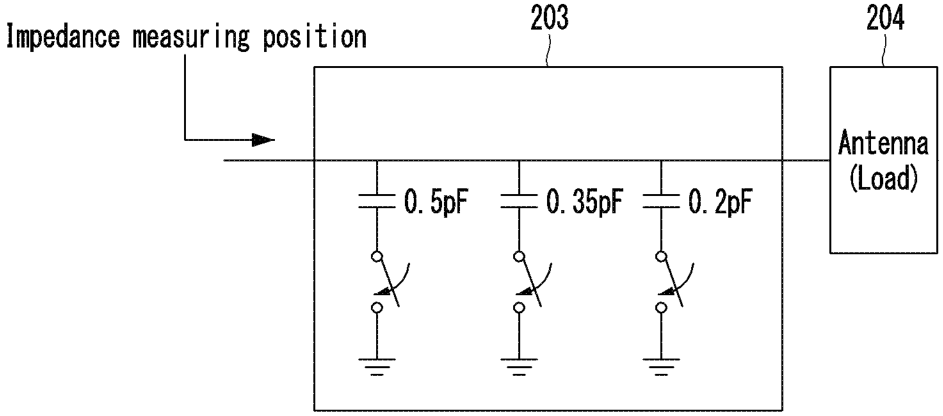
FIG. 9 is a block diagram of another exemplary embodiment of the sensing and matching impedance network.
Figure 10:
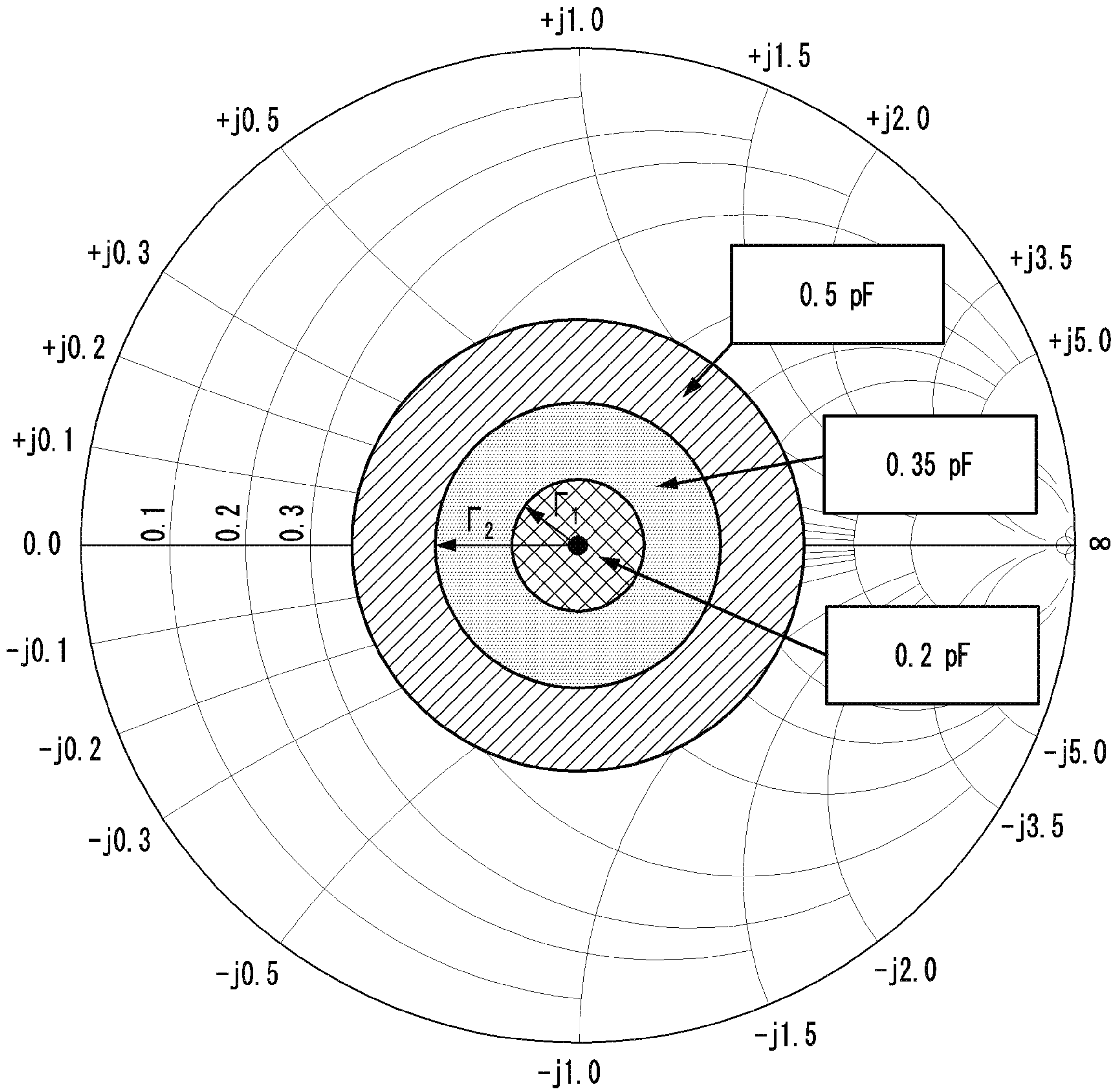
FIG. 10 is the Smith chart for explaining an example of the operation of the reflected wave phase discriminator according to the embodiment of FIG. 9.

FIG. 9 is a block diagram of another exemplary embodiment of the sensing and matching impedance network 203, and FIG. 10 is a Smith chart for explaining an example of the operation of the reflected wave phase discriminator according to the embodiment of FIG. 9.

Referring to FIG. 9, in order to increase an accuracy of determining the phase range of the reflection coefficient or the region where the load impedance is positioned on the Smith chart, the sensing impedance circuit of the sensing and matching impedance network 203 may be configured to include a plurality of capacitors which may be connected in parallel. In detail, the sensing impedance circuit may include a first capacitor of 0.5 pF, a second capacitor of 0.35 pF, and a third capacitor of 0.2 pF. The sensing impedance circuit may further include a first through third switches connected in series to the first through third capacitors, respectively. The three series circuits of one capacitor and one switch may be connected in parallel with each other and disposed between an input terminal of the load 204 and ground.

According to the present embodiment, the sensing impedance selector 208 of the reflected wave phase discriminator may select the sensing impedance differently according to the magnitude of the first reflection coefficient. For example, as shown in FIG. 10, when the magnitude of the first reflection coefficient is greater than a first threshold $\Gamma_1$ and the point representing the load impedance is positioned in a region indicated by an outermost ring among the three rings or outside thereof, the reflection signal phase discriminator may select the first capacitor as the sensing impedance. When the magnitude of the first reflection coefficient is smaller than the first threshold Ti and greater than a second threshold I'2 and the point representing the load impedance is positioned in a region indicated by a middle ring among the three rings, the reflection signal phase discriminator may select the second capacitor as the sensing impedance. When the magnitude of the first reflection coefficient is smaller than the second threshold I'2 and the point representing the load impedance is positioned in a region indicated by an innermost ring among the three rings, the reflection signal phase discriminator may select the third capacitor as the sensing impedance.

According to the present embodiment, the reflected wave phase discriminator may correctly determine whether the point representing the load impedance is positioned the upper half plane region or the upper half plane region of the chart by varying the sensing impedance according to the magnitude of the first reflection coefficient.

Meanwhile, in an alternative embodiment, the reflected wave phase discriminator may select a combination of two or more of the first through third capacitors in the sensing impedance circuit as the sensing impedance. More generally, the sensing impedance circuit may include a series capacitor circuit, a series-parallel capacitor circuit, a parallel inductor circuit, a series inductor circuit, a series-parallel inductor circuit, or a combination thereof instead of the single capacitor circuit and the parallel capacitor circuit described above.

Figure 11:
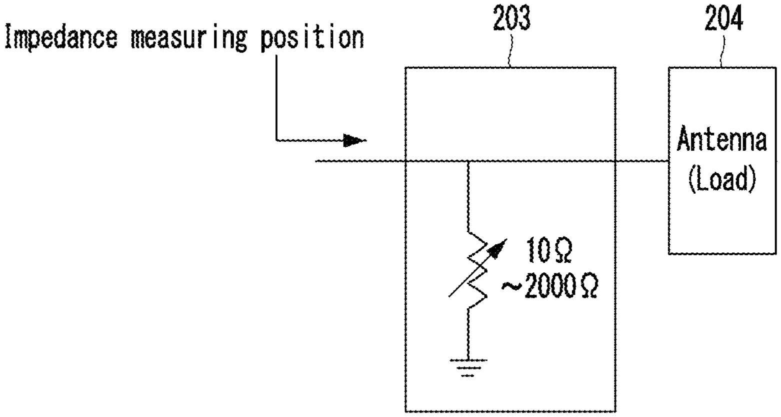
FIG. 11 is a block diagram of another exemplary embodiment of the sensing and matching impedance network.
Figure 12:
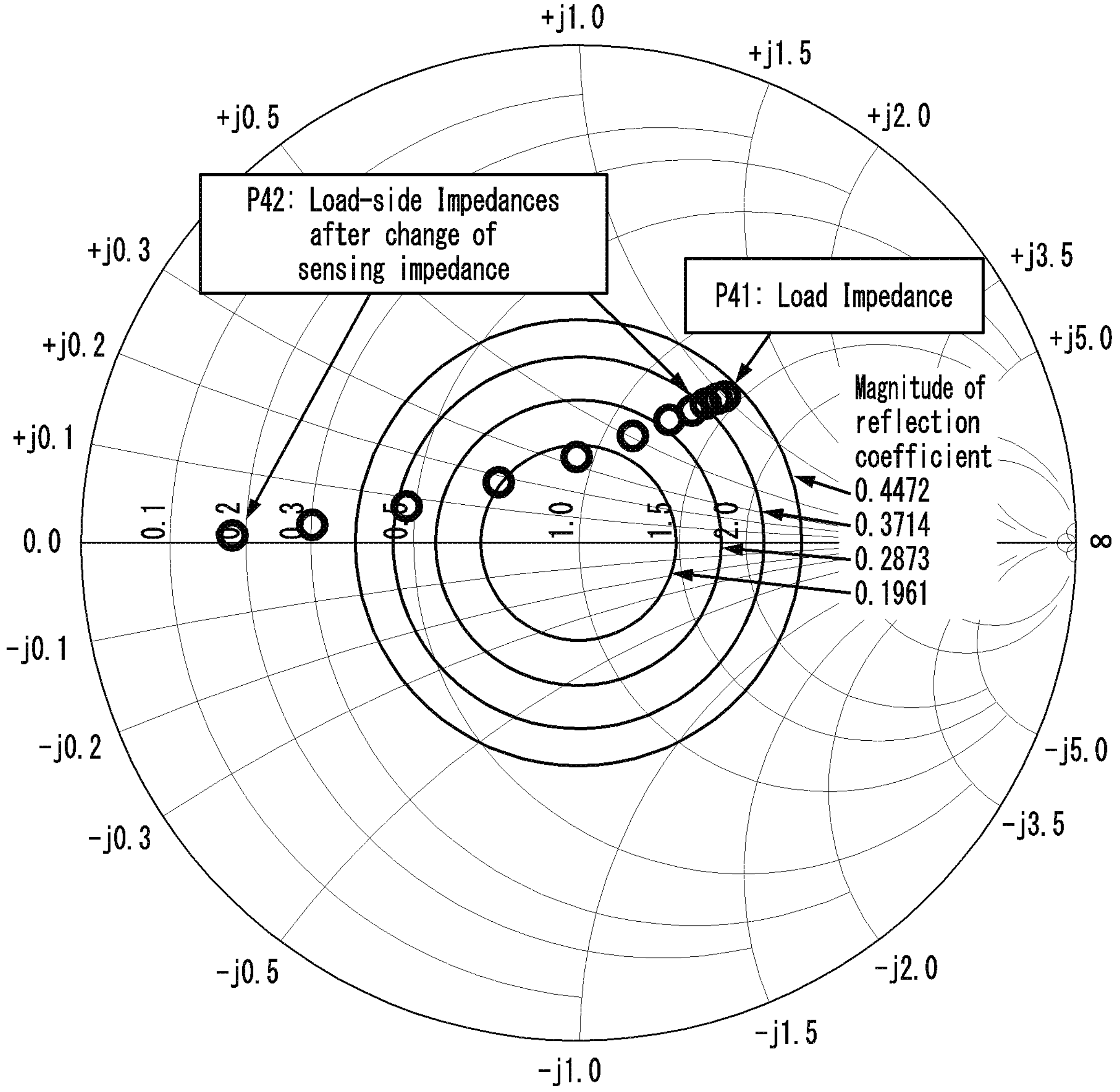
FIGS. 12 and 13 are illustrations for explaining a first example of the operation of the reflected wave phase discriminator according to the embodiment of FIG. 11.
Figure 13:
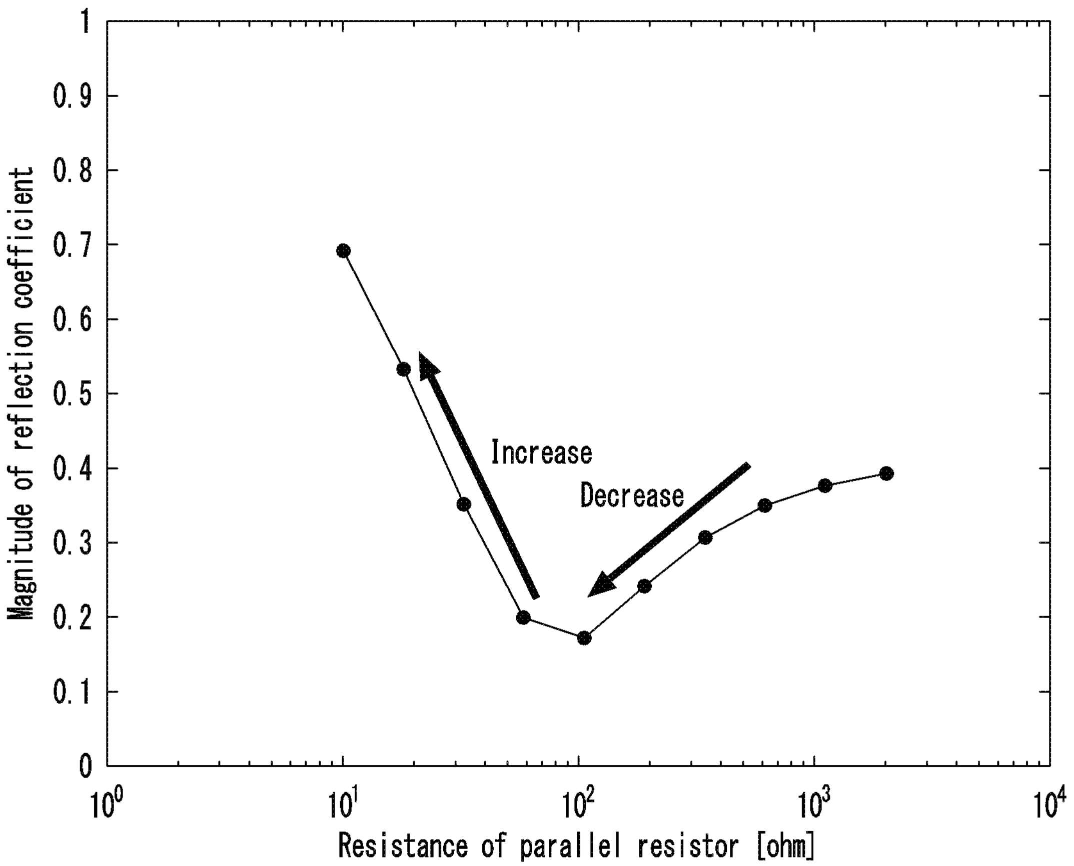

FIG. 11 is a block diagram of another exemplary embodiment of the sensing and matching impedance network 203, and FIGS. 12 and 13 are illustrations for explaining a first example of the operation of the reflected wave phase discriminator according to the embodiment of FIG. 11.

The sensing and matching impedance network 203 shown in FIG. 11 includes only the sensing impedance circuit without the impedance matching circuit, and the sensing impedance circuit includes a variable resistor. For convenience of description, the load 204 is also shown in FIG. 3.

Referring to FIG. 11, the controller 210 of the reflected wave phase discriminator may control the sensing and matching impedance network 203 to change a resistance of the variable resistor, and may determine whether the phase of the first reflection coefficient is in a range between 90 degrees and 270 degrees and a point representing the load impedance is in a left half plane region of the Smith chart or the phase of the first reflection coefficient is in a range between 270 degrees and 90 degrees and the point representing the load impedance is in a right half plane region of the Smith chart. For a detailed description of the exemplary operation, it is assumed that the characteristic impedance or output impedance of the amplifier 201 is 50Ω and the load impedance is 70+j50Ω at a working frequency of 2.4 GHz. Also, it is assumed that that the resistance of the variable resistor in the sensing impedance circuit is variable in a range between 10Ω and 2,000Ω.

In this example, the load impedance of 70+j50Ω is plotted at a point P41 where a constant resistance circle of R=1.4 intersects a constant reactance curve of Z=j1.0. In a state that the resistance of the variable resistor is set to a first resistance, for example, a maximum value of 2,000 Ω2, the impedance seen from the source side is almost the same as the load impedance and a point representing the impedance seen from the source side is positioned closely to the point representing the load impedance in the chart. The signal intensity detector 205 may determine the intensity of the amplified RF transmit signal and the intensity of the reflected signal and output the intensities of the amplified RF transmit signal and the reflected signal to the reflection coefficient magnitude calculator 206. The reflection coefficient magnitude calculator 206 may calculate the magnitude of the first reflection coefficient based on the intensities of the amplified RF transmit signal and the reflected signal and output the magnitude of the first reflection coefficient to the reflected signal phase region discriminator 207 and the sensing impedance selector 208. The sensing impedance selector 208 may determine the sensing impedance, that is, the resistance of the variable resistor from the range between 10Ω and 2,000Ω.

Then, the impedance controller 209 may output the control signal to the sensing impedance circuit of the sensing and matching impedance network 203 to control the sensing impedance circuit such that the sensing impedance of the sensing impedance circuit is set to the impedance determined by the sensing impedance selector 208. The sensing impedance cause the impedance seen from the source side to be changed into the second impedance from the first impedance, which in turn changes the intensity of the reflected signal. The signal intensity detector 205 may determine the intensity of the reflected signal, and the reflection coefficient magnitude calculator 206 may calculate the magnitude of the second reflection coefficient based on the intensities of the amplified RF transmit signal and the reflected signal after the change of the sensing impedance.

The reflected signal phase region discriminator 207 may compare the magnitude of the first reflection coefficient obtained before the change of the sensing impedance with the magnitude of the second reflection coefficient obtained after the change of the sensing impedance. At this time, even if the load impedance is not known exactly, the reflected signal phase region discriminator 207 may determine that the phase of the first reflection coefficient is in the range between 270 degrees and 90 degrees, that is, the point P41 representing the load impedance is in the right half plane region of the chart based on the change pattern of the magnitudes of the reflection coefficients or by calculating a certain discriminant in a mathematical form.

Regarding the determination of the phase range of the first reflection coefficient based on the change pattern of the magnitudes of the reflection coefficients or by calculating the discriminant, it is to be noted that the change pattern of the magnitudes of the reflection coefficients has a following property according to the change in the sensing impedance. When the resistance of the variable resistor used as the sensing impedance is gradually decreased from a upper limit of 2,000Ω to a lower limit of 10Ω, a conductance of an admittance corresponding to the impedance seen from the source side increases without a change in a susceptance, and accordingly, the point representing the impedance moves along a constant susceptance curve toward a side of smaller conductance, that is, to the left in the chart as shown in FIG. 12. Therefore, in case that the point representing the load impedance is positioned in the right half plane region of the chart, as the resistance of the variable resistor in the sensing impedance circuit decreases, the magnitude of the reflection coefficient reveals a tendency to decrease and then increase again as shown in FIG. 13.

Figure 14:
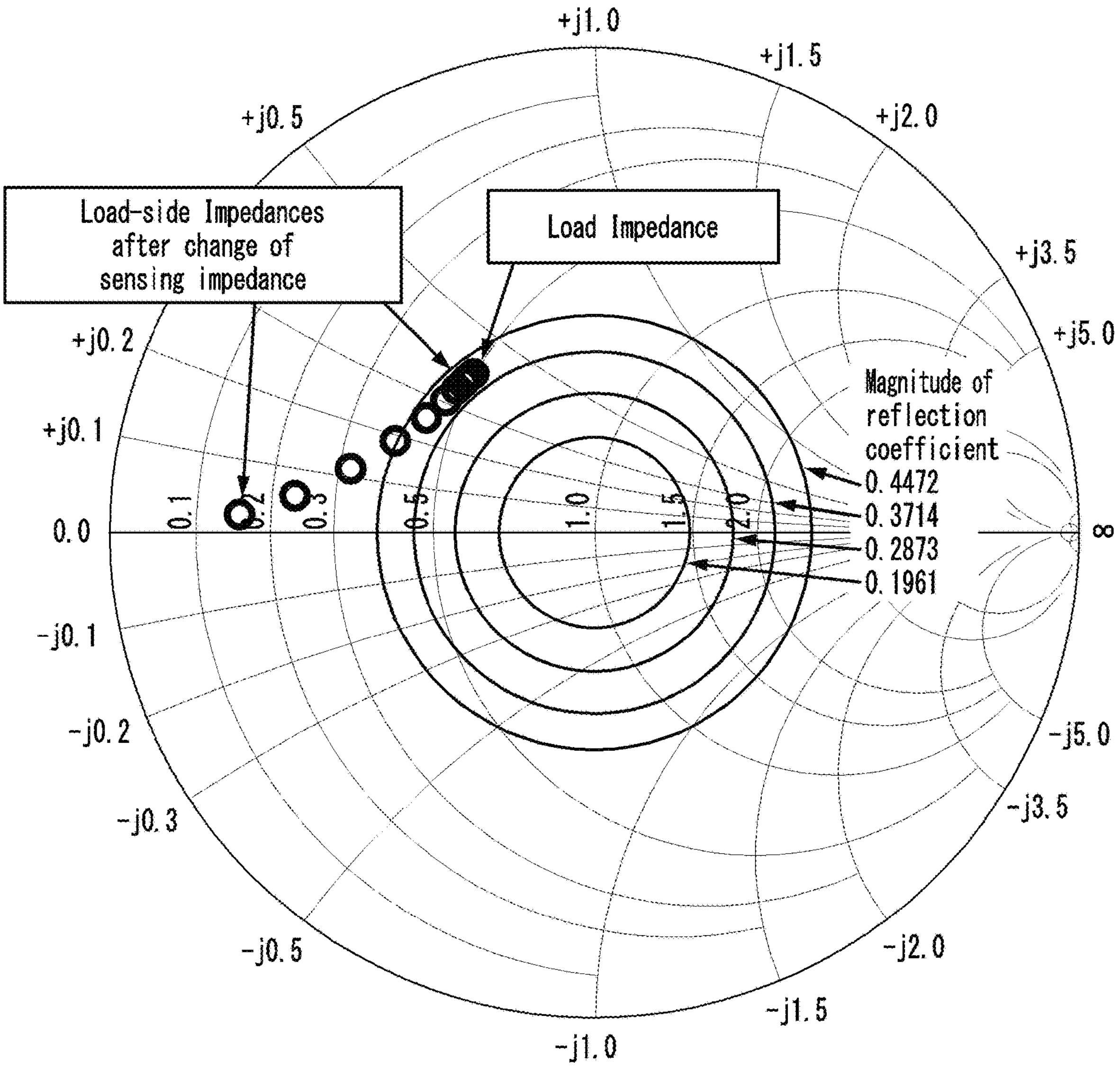
FIGS. 14 and 15 are illustrations for explaining a second example of the operation of the reflected wave phase discriminator according to the embodiment of FIG. 11.
Figure 15:
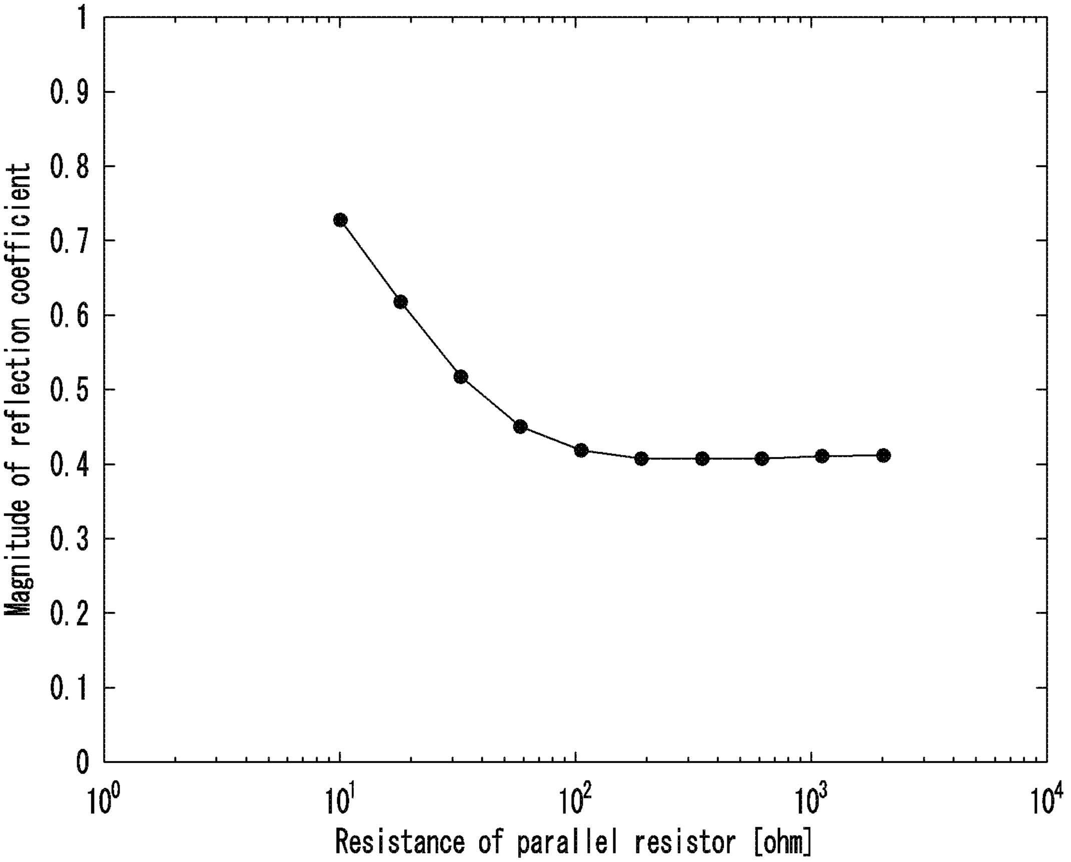

FIGS. 14 and 15 are illustrations for explaining a second example of the operation of the reflected wave phase discriminator according to the embodiment of FIG. 11.

Referring to FIG. 14, the controller of the reflected wave phase discriminator may control the sensing and matching impedance network to change the resistance of the variable resistor, and may determine whether the phase of the first reflection coefficient is in the range between 90 degrees and 270 degrees and the point representing the load impedance is in the left half plane region of the Smith chart or the phase of the first reflection coefficient is in the range between 270 degrees and 90 degrees and the point representing the load impedance is in the right half plane region of the Smith chart. For a detailed description of the exemplary operation, it is assumed that the characteristic impedance or output impedance of the amplifier 201 is 50Ω and the load impedance is 25+j20Ω at a working frequency of 2.4 GHz. Also, it is assumed that that the resistance of the variable resistor in the sensing impedance circuit is variable in the range between 10Ω and 2,000Ω.

In this example, the load impedance of 25+j20Ω is plotted at a point P41 (refer to FIG. 12) where a constant resistance circle of R=0.5 intersects a constant reactance curve of Z=j0.4. In a state that the resistance of the variable resistor is set to a first resistance, for example, a maximum value of 2,000Ω, the impedance seen from the source side is almost the same as the load impedance and a point representing the impedance seen from the source side is positioned closely to the point representing the load impedance in the chart. The signal intensity detector 205 may determine the intensity of the amplified RF transmit signal and the intensity of the reflected signal and output the intensities of the amplified RF transmit signal and the reflected signal to the reflection coefficient magnitude calculator 206. The reflection coefficient magnitude calculator 206 may calculate the magnitude of the first reflection coefficient based on the intensities of the amplified RF transmit signal and the reflected signal and output the magnitude of the first reflection coefficient to the reflected signal phase region discriminator and the sensing impedance selector. The sensing impedance selector may determine the sensing impedance, that is, the resistance of the variable resistor from the range between 10Ω and 2,000Ω.

Then, the impedance controller may output the control signal to the sensing impedance circuit of the sensing and matching impedance network 203 to control the sensing impedance circuit such that the sensing impedance of the sensing impedance circuit is set to the impedance determined by the sensing impedance selector. The sensing impedance cause the impedance seen from the source side to be changed into the second impedance from the first impedance, which in turn changes the intensity of the reflected signal.

Also, the signal intensity detector may determine the intensity of the reflected signal, and the reflection coefficient magnitude calculator may calculate the magnitude of the second reflection coefficient based on the intensities of the amplified RF transmit signal and the reflected signal after the change of the sensing impedance. The reflected signal phase region discriminator 207 may compare the magnitude of the first reflection coefficient obtained before the change of the sensing impedance with the magnitude of the second reflection coefficient obtained after the change of the sensing impedance. At this time, even if the load impedance is not known exactly, the reflected signal phase region discriminator 207 may determine that the phase of the first reflection coefficient is in the range between 270 degrees and 90 degrees and the point P41 representing the load impedance is in the right half plane region of the chart based on the change pattern of the magnitudes of the reflection coefficients or by calculating a certain discriminant in the mathematical form.

Regarding the determination of the phase range of the first reflected waves based on the change pattern of the magnitudes of the reflection coefficients or by calculating the discriminant, it is to be noted that the change pattern of the magnitudes of the reflection coefficients has a following property according to the change in the sensing impedance. When the resistance of the variable resistor used as the sensing impedance is gradually decreased from a upper limit of 2,000Ω to a lower limit of 10Ω, a conductance of an admittance corresponding to the impedance seen from the source side increases without a change in a susceptance, and accordingly, the point representing the impedance moves along a constant susceptance curve toward a side of smaller conductance, that is, to the left in the chart as shown in FIG. 12. Therefore, in case that the point representing the load impedance is positioned in the right half plane region of the chart, as the resistance of the variable resistor in the sensing impedance circuit decreases, the magnitude of the reflection coefficient reveals a tendency to increase monotonically as shown in FIG. 15. In detail, as the resistance of the variable resistor decreases, the magnitude of the reflection coefficient initially increases at a small slope and then increases sharply.

Although a parallel variable resister circuit is used as the sensing impedance circuit in the above-described embodiment, the present disclosure is not limited thereto and a series resistor circuit or a series-parallel resistor circuit may be used as well. Here, the resistor may be implemented using a discrete resistor device or a semiconductor device.

Alternatively, the sensing impedance circuit may include a series capacitor circuit, a series-parallel capacitor circuit, a parallel inductor circuit, a series inductor circuit, a series-parallel inductor circuit, a parallel resistor circuit, a series resistor circuit, a series-parallel resistor circuit, or a combination thereof instead of the single capacitor circuit, the parallel capacitor circuit, and the variable resistor circuit described above.

Meanwhile, the determination of whether the point representing the load impedance is positioned in the right half plane region or the left half plane region of the chart described above with reference to FIGS. 11-15 may be performed by using a phase region discriminant in a mathematical form by the reflected signal phase region discriminator 207. For example, the phase region discriminant D may be expressed in equation 1.

[Equation 1]

$$D = \frac{|\Gamma|_{load} - |\Gamma|_{min}}{|\Gamma|_{load}^2}$$

In equation 1, $|\Gamma|_{load}$ denotes the magnitude of a reflection coefficient caused by the load impedance before the application of the sensing impedance, and $|\Gamma|_{min}$ denotes a minimum of the magnitudes of the reflection coefficients caused by the load-side impedance when the sensing impedance of the sensing impedance circuit comprised of a parallel resistance is changed contiguously.

Examples of determining the region of the point representing the load impedance according to the variation of the sensing impedance may be illustrated by FIGS. 16-19.

FIGS. 16-19 are illustrations for explaining examples of the operation of the reflected wave phase discriminator shown in FIG. 2.

Figure 16:
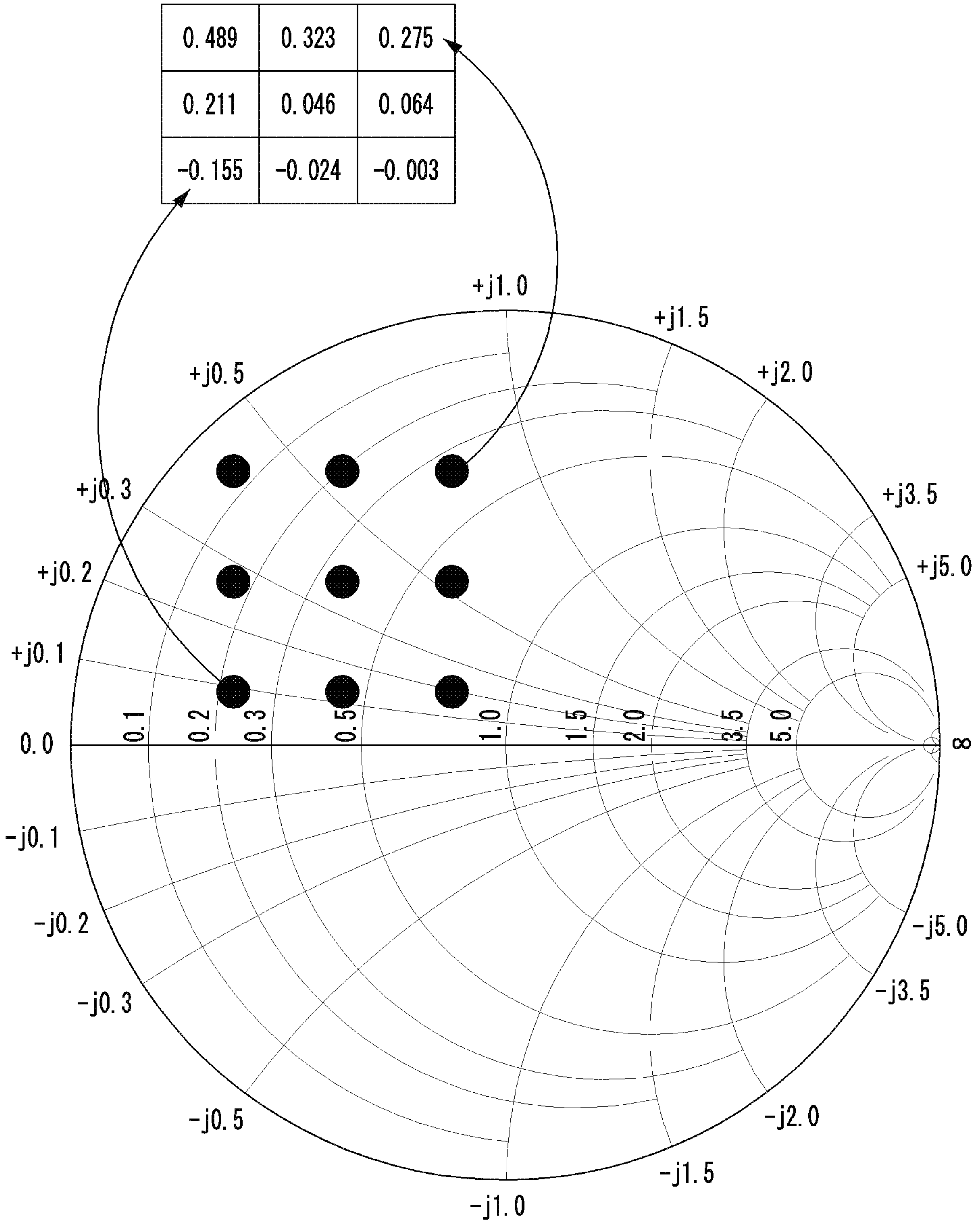
FIGS. 16 through 19 are illustrations for explaining examples of the operation of the reflected wave phase discriminator shown in FIG. 2.
Figure 17:
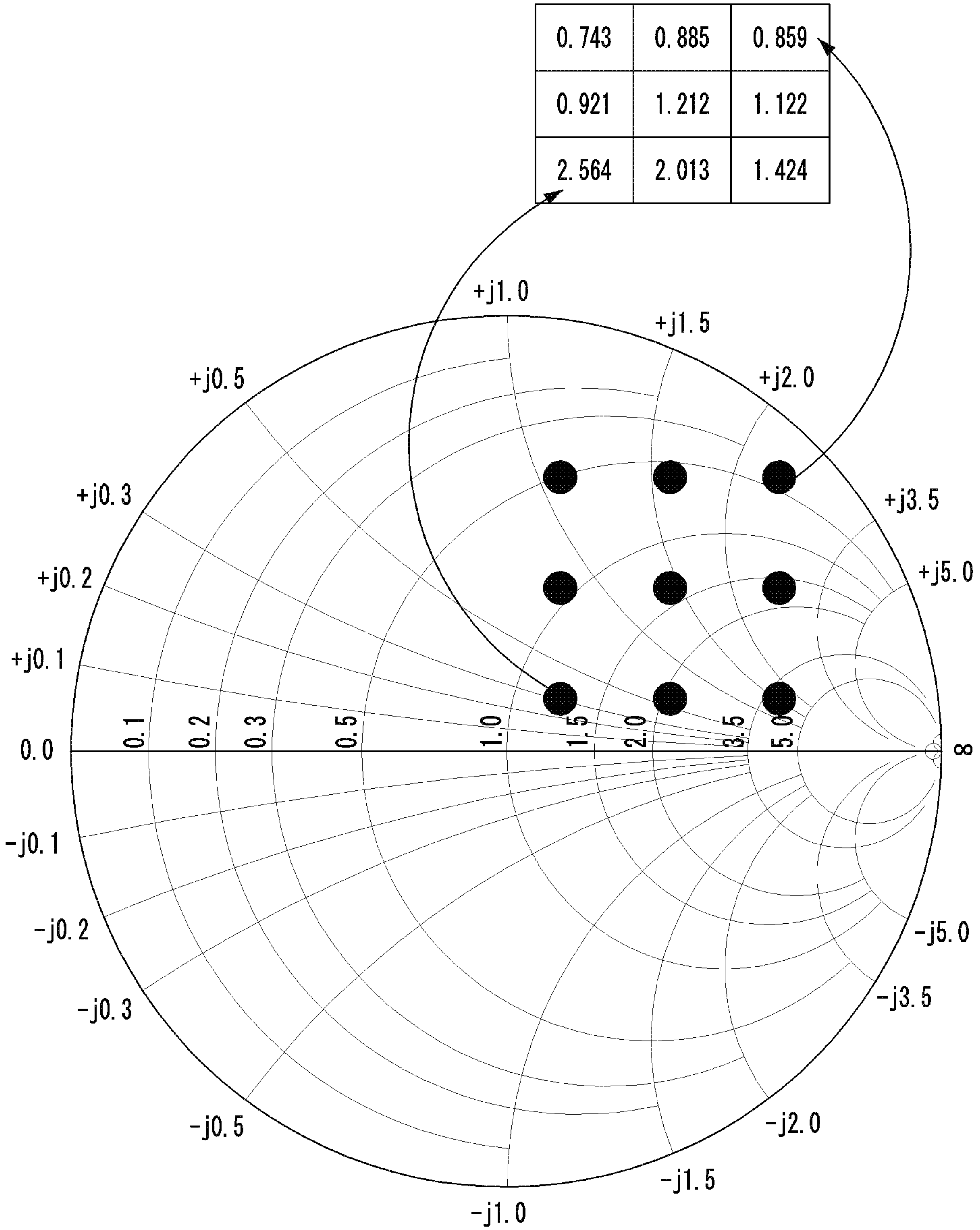
Figure 18:
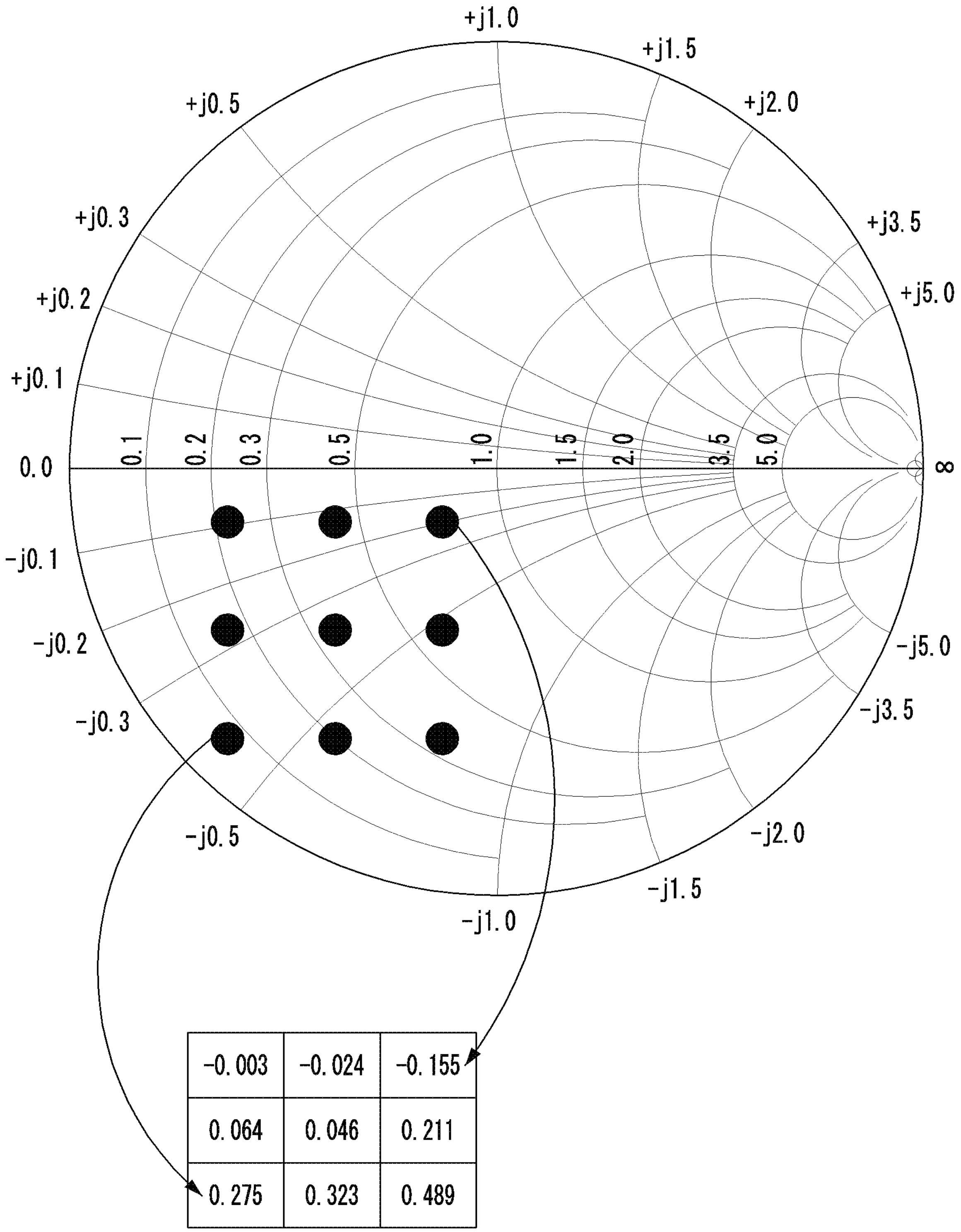
Figure 19:
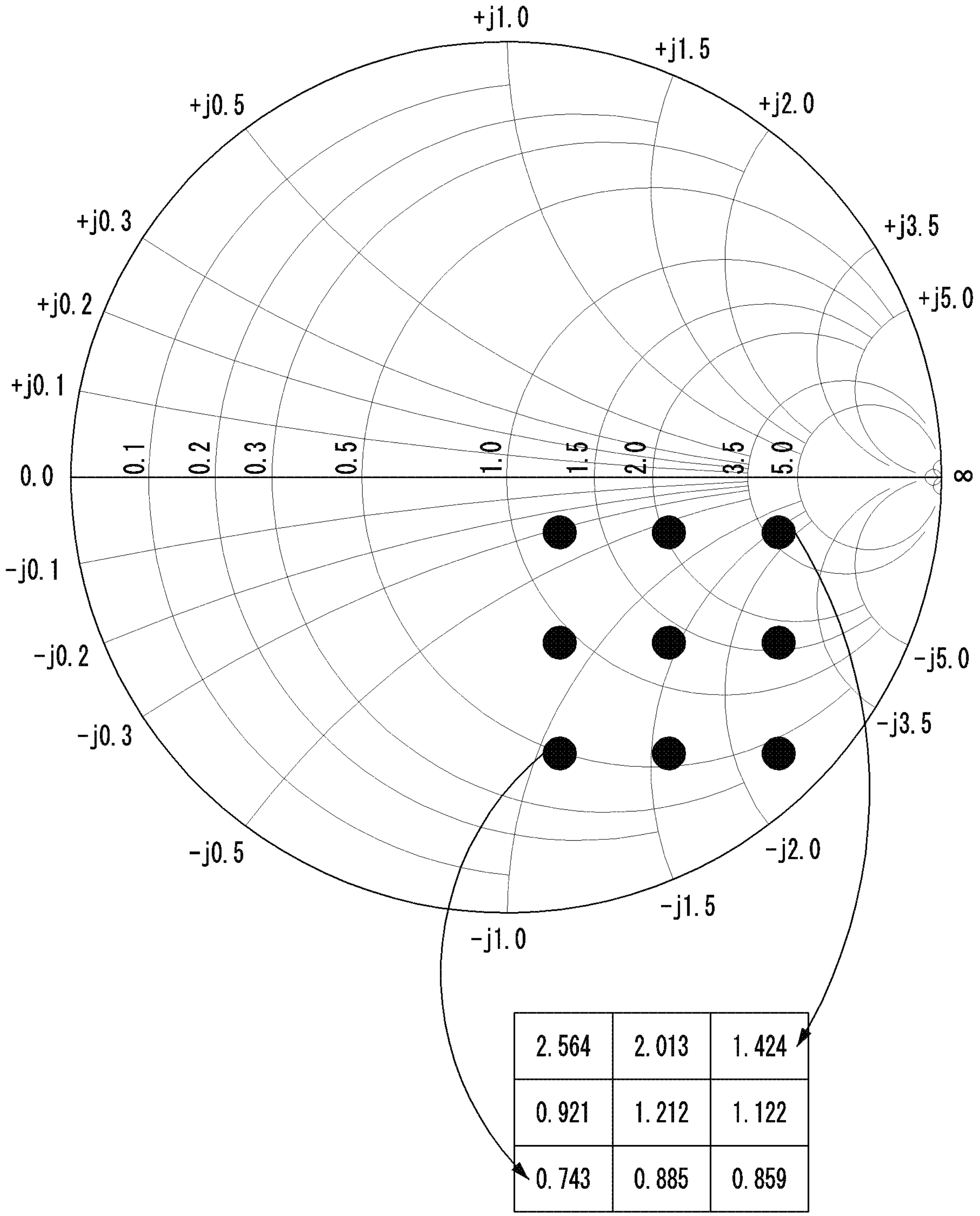

As shown in FIGS. 16 and 18, when the phase of the reflected waves is in the range between 90 degrees and 270 degrees, that is, the point representing the load impedance is in the right half plane region of the chart, the value of the phase region discriminant D calculated by equation 1 is always smaller than 0.6. On the other hand, as shown in FIGS. 17 and 19, the phase of the reflected waves is in the range between 270 degrees and 90 degrees, that is, the point representing the load impedance is in the right half plane region of the chart, the value of the phase region discriminant D is always greater than or equal to 0.6.

In this way, the reflected signal phase region discriminator 207 may determine whether the point representing the load impedance is positioned in the right half plane region or the left half plane region of the chart by changing the sensing impedance.

To summarize, the reflected wave phase discriminator may determine whether the point representing the load impedance is in the upper half plane region or in the lower half plane region of the chart by adding or changing the sensing impedance, in particular, the reactance component of the sensing impedance, and then determine whether the point representing the load impedance is in the left half plane region or in the right half plane region of the chart by adding or changing the sensing impedance, in particular, the resistance component of the sensing impedance. Of course, the reflected wave phase discriminator may first determine whether the point representing the load impedance is in the left half plane region or in the right half plane region of the chart, and then determine whether the point representing the load impedance is in the upper half plane region or in the lower half plane region of the chart.

Therefore, the reflected wave phase discriminator may determine a quadrant of the Smith chart in which the point representing the load impedance is positioned even if the load impedance is not known exactly. After the phase range of the reflected waves or the region of the point representing the load impedance in the chart is determined, the controller 210 may control the impedance matching circuit in the sensing and matching impedance network 203 to change a matching impedance in order to match the load impedance to the output impedance of the amplifier 201 or the characteristic impedance of the transmission channel between a source and the load.

Alternatively, the reflected wave phase discriminator may determine only whether the point representing the load impedance is in the upper half plane region or in the lower half plane region of the chart depending on an application or an available hardware capacity.

Also, the reflected wave phase discriminator may determine only whether the point representing the load impedance is in the left half plane region or in the right half plane region of the chart depending on an application or an available hardware capacity.

Figure 20:
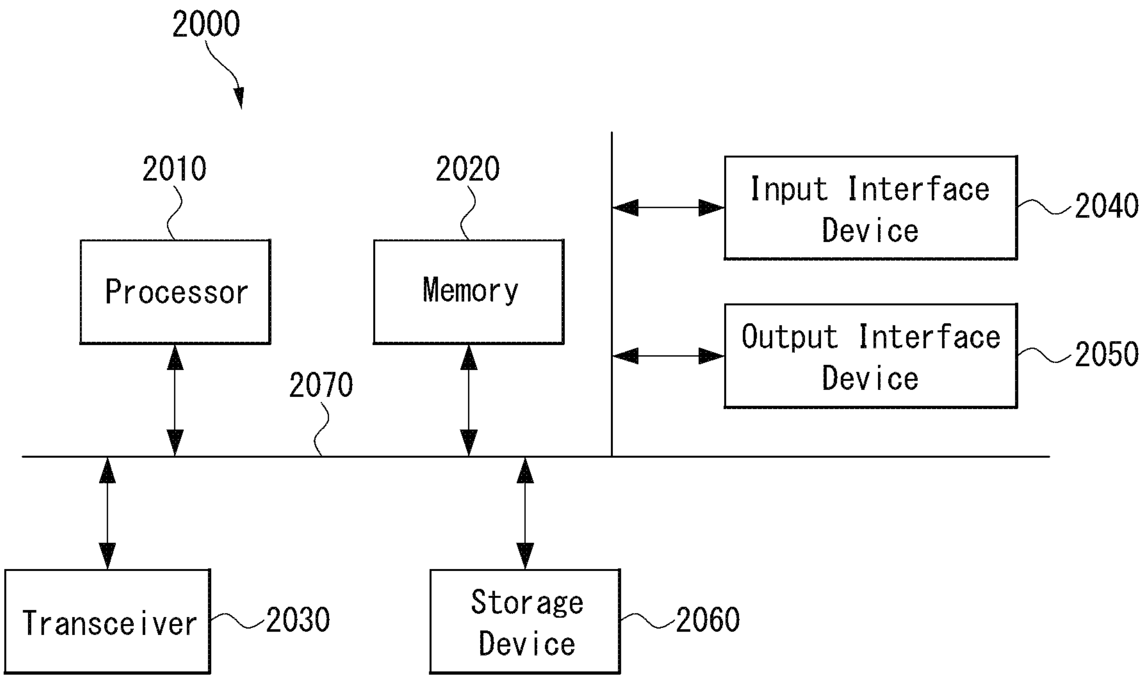
FIG. 20 is a schematic block diagram of a controller shown in FIG. 2.

FIG. 20 is a schematic block diagram of the controller 210 shown in FIG. 2.

Referring to FIG. 20, the controller 210 may include at least one processor 2010, a memory 2020, and a transceiver 2030 that may be connected to a network and perform communications with another apparatus. In addition, the controller 210 may further include an input interface device 2040, an output interface device 2050, and a storage device 2060. The components in the controller 210 may be connected to each other by a bus 2070.

However, each component in the controller 210 may be connected through an individual interface or an individual bus disposed to be connected to the processor 2010, rather than the common bus 2070. For example, the processor 2010 may be connected to at least one of the memory 2020, the transceiver 2030, the input interface device 2040, the output interface device 2050, and the storage device 2060 through a dedicated interface.

The processor 2010 may execute program instructions stored in at least one of the memory 2020 and the storage device 2060. The processor 2010 may include a central processing unit (CPU) or a general-purpose processing unit (GPU) or may be implemented by another kind of dedicated processor suitable for performing the method of the present disclosure. Each of the memory 2020 and the storage device 2060 may be comprised of at least one of a volatile storage medium and a non-volatile storage medium. For example, the memory 2020 may be comprised of at least one of a read only memory (ROM) and a random access memory (RAM).

On the other hand, in an exemplary embodiment, the sensing impedance may be implemented to taking into account an environmental change according to a temperature. In such a case, the controller 210 may be configured to acquire temperature information directly or indirectly from a temperature sensor inside or outside the reflected wave phase discriminator and select the sensing impedance taking the temperature into account in addition to the first reflection coefficient.

The apparatus and method according to exemplary embodiments of the present disclosure can be implemented by computer-readable program codes or instructions stored on a computer-readable intangible recording medium. The computer-readable recording medium includes all types of recording device storing data which can be read by a computer system. The computer-readable recording medium may be distributed over computer systems connected through a network so that the computer-readable program or codes may be stored and executed in a distributed manner.

The computer-readable recording medium may include a hardware device specially configured to store and execute program instructions, such as a ROM, RAM, and flash memory. The program instructions may include not only machine language codes generated by a compiler, but also high-level language codes executable by a computer using an interpreter or the like.

Some aspects of the present disclosure described above in the context of the apparatus may indicate corresponding descriptions of the method according to the present disclosure, and the blocks or apparatus may correspond to operations of the method or features of the operations. Similarly, some aspects described in the context of the method may be expressed by features of blocks, items, or apparatus corresponding thereto. Some or all of the operations of the method may be performed by use of a hardware device such as a microprocessor, a programmable computer, or electronic circuits, for example. In some exemplary embodiments, one or more of the most important operations of the method may be performed by such a device.

In some exemplary embodiments, a programmable logic device such as a field-programmable gate array may be used to perform some or all of functions of the methods described herein. In some exemplary embodiments, the field-programmable gate array may be operated with a microprocessor to perform one of the methods described herein. In general, the methods are preferably performed by a certain hardware device.

The description of the disclosure is merely exemplary in nature and, thus, variations that do not depart from the substance of the disclosure are intended to be within the scope of the disclosure. Such variations are not to be regarded as a departure from the spirit and scope of the disclosure. Thus, it will be understood by those of ordinary skill in the art that various changes in form and details may be made without departing from the spirit and scope as defined by the following claims.

What is claimed is:

1. A reflected wave phase discriminator for discriminating a range of a phase of a reflected waves based on a magnitude of the reflection coefficient between a signal source and a load to compensate for an impedance mismatch, comprising:

a sensing impedance network disposed between the signal source and the load and comprising a sensing impedance circuit of which sensing impedance is variable;

a directional coupler disposed between the signal source and the sensing impedance network; and a controller connected to the directional coupler and the sensing impedance network and configured to detect intensities of an input signal transmitted from the signal source to the load and a reflected signal reflected from the load, determine the magnitude of the reflection coefficient based on the intensities of the input signal and the reflected signal, determine a difference in the magnitude of the reflection coefficient based on a plurality of magnitudes of the reflection coefficients obtained with respect to different sensing impedances, discriminate the range of the phase of the reflection coefficient based on the difference in the magnitude of the reflection coefficient, and control the sensing impedance network to change the sensing impedance.

2. The reflected wave phase discriminator of claim 1, wherein the sensing impedance network comprises a parallel capacitor circuit, a series capacitor circuit, a series-parallel capacitor circuit, a parallel inductor circuit, a series inductor circuit, a series-parallel inductor circuit, a parallel resistor circuit, a series resistor circuit, a series-parallel resistor circuit, or a combination thereof.

3. The reflected wave phase discriminator of claim 1, wherein the controller discriminates the range of the phase of the reflection coefficient by use of a phase region discriminant expressed in a following equation:

$$D = \frac{|\Gamma|_{load} - |\Gamma|_{min}}{|\Gamma|_{load}^2}$$

where $|\Gamma|_{load}$ denotes the magnitude of a reflection coefficient caused by a load impedance of the load before a change in the sensing impedance, and $|\Gamma|_{min}$ denotes a second reflection coefficient which is a minimum of magnitudes of the reflection coefficients after the change in the sensing impedance when a resistive component of the sensing impedance of the sensing impedance circuit is changed contiguously.

4. The reflected wave phase discriminator of claim 3, wherein the controller compares a value of the phase region discriminant with a predetermined threshold to determine whether a point representing the reflection coefficient is positioned in a left half plane region or in a right half plane region of a Smith chart.

5. The reflected wave phase discriminator of claim 1, wherein the controller determines whether a point representing the reflection coefficient is positioned in a left half plane region or in a right half plane region of a Smith chart based on an increasing and/or decreasing pattern of the magnitude of the reflection coefficient according to a change in the sensing impedance when a resistive component of the sensing impedance of the sensing impedance circuit is changed contiguously.

6. The reflected wave phase discriminator of claim 1, wherein the controller determines whether a point representing the reflection coefficient is positioned in a upper half plane region or in a lower half plane region of a Smith chart based on an increasing and/or decreasing pattern of the magnitude of the reflection coefficient according to a change in a reactive component of the sensing impedance.

7. A reflected wave phase discriminator, comprising:

a sensing impedance network disposed immediately before a load and comprising a sensing impedance circuit of which sensing impedance is variable;

a signal intensity detector configured to detect intensities of an input signal from a signal source to the load and a reflected signal reflected from the load;

a reflection coefficient magnitude calculator configured to calculate a magnitude of a reflection coefficient based on the intensities of the input signal and the reflected signal;

a sensing impedance selector configured to select the sensing impedance to a predetermined value according to the magnitude of the reflection coefficient to apply to the sensing impedance circuit;

a reflected signal phase region discriminator configured to determine a difference in the magnitude of the reflection coefficient based on a plurality of magnitudes of the reflection coefficients obtained with respect to different sensing impedances and discriminate a range of a phase of the reflection coefficient based on the difference in the magnitude of the reflection coefficient; and an impedance controller configured to control the sensing impedance network to change the sensing impedance according to selection information from the sensing impedance selector.

8. The reflected wave phase discriminator of claim 7, wherein the sensing impedance network comprises a parallel capacitor circuit, a series capacitor circuit, a series-parallel capacitor circuit, a parallel inductor circuit, a series inductor circuit, a series-parallel inductor circuit, a parallel resistor circuit, a series resistor circuit, a series-parallel resistor circuit, or a combination thereof.

9. The reflected wave phase discriminator of claim 7, wherein the reflected signal phase region discriminator discriminates the range of the phase of the reflected waves by use of a phase region discriminant expressed in a following equation:

$$D = \frac{|\Gamma|_{load} - |\Gamma|_{min}}{|\Gamma|_{load}^2}$$

where $|\Gamma|_{load}$ denotes the magnitude of a reflection coefficient caused by a load impedance of the load before a change in the sensing impedance, and $|\Gamma|_{min}$ denotes a second reflection coefficient which is a minimum of magnitudes of the reflection coefficients after the change in the sensing impedance when a resistive component of the sensing impedance of the sensing impedance circuit is changed contiguously.

10. The reflected wave phase discriminator of claim 9, wherein the reflected signal phase region discriminator compares a value of the phase region discriminant with a predetermined threshold to determine whether a point representing the reflection coefficient is positioned in a left half plane region or in a right half plane region of a Smith chart.

11. The reflected wave phase discriminator of claim 7, wherein the reflected signal phase region discriminator determines whether a point representing the reflection coefficient is positioned in a left half plane region or in a right half plane region of a Smith chart based on an increasing and/or decreasing pattern of the magnitude of the reflection coefficient according to a change in the sensing impedance when a resistive component of the sensing impedance of the sensing impedance circuit is changed contiguously.

12. The reflected wave phase discriminator of claim 7, wherein the reflected signal phase region discriminator determines whether a point representing the reflection coefficient is positioned in a upper half plane region or in a lower half plane region of a Smith chart based on an increasing and/or decreasing pattern of the magnitude of the reflection coefficient according to a change in a reactive component of the sensing impedance.

13. The reflected wave phase discriminator of claim 7, further comprising:

a directional coupler disposed between the signal source and the sensing impedance network.

14. A method of discriminating a range of a phase of reflected waves based on a magnitude of the reflection coefficient between a signal source and a load to compensate an impedance mismatch, the method comprising:

detecting intensities of an input signal transmitted from the signal source to the load and a reflected signal reflected from the load;

determining the magnitude of the reflection coefficient based on the intensities of the input signal and the reflected signal;

determining a difference in the magnitude of the reflection coefficient based on a plurality of magnitudes of the reflection coefficients obtained with respect to different sensing impedances;

discriminating the range of the phase of the reflected waves based on the difference in the magnitude of the reflection coefficient; and controlling a sensing impedance network disposed between the signal source and the load to change a sensing impedance of the sensing impedance network.

15. The method of claim 14, wherein the sensing impedance network comprises a parallel capacitor circuit, a series capacitor circuit, a series-parallel capacitor circuit, a parallel inductor circuit, a series inductor circuit, a series-parallel inductor circuit, a parallel resistor circuit, a series resistor circuit, a series-parallel resistor circuit, or a combination thereof.

16. The method of claim 14, wherein, in the discriminating of the range of the phase, the range of the phase is discriminated by use of a phase region discriminant expressed in a following equation:

$$D = \frac{|\Gamma|_{load} - |\Gamma|_{min}}{|\Gamma|_{load}^2}$$

where $|\Gamma|_{load}$ denotes the magnitude of a reflection coefficient caused by a load impedance of the load before a change in the sensing impedance, and $|\Gamma|_{min}$ denotes a second reflection coefficient which is a minimum of magnitudes of the reflection coefficients after the change in the sensing impedance when a resistive component of the sensing impedance of the sensing impedance circuit is changed contiguously.

17. The method of claim 16, wherein the discriminating of the range of the phase comprises:

comparing a value of the phase region discriminant with a predetermined threshold; and determining whether a point representing the reflection coefficient is positioned in a left half plane region or in a right half plane region of a Smith chart according to a comparison result.

18. The method of claim 14, wherein the discriminating of the range of the phase comprises:

identifying an increasing and/or decreasing pattern of the magnitude of the reflection coefficient according to a change in the sensing impedance when a resistive component of the sensing impedance of the sensing impedance circuit is changed contiguously; and determining whether a point representing the reflection coefficient is positioned in a left half plane region or in a right half plane region of a Smith chart according to an identification result.

19. The method of claim 14, wherein the discriminating of the range of the phase comprises:

identifying an increasing and/or decreasing pattern of the magnitude of the reflection coefficient according to a change in a reactive component of the sensing impedance; and determining whether a point representing the reflection coefficient is positioned in a upper half plane region or in a lower half plane region of a Smith chart according to an identification result.

20. The method of claim 14, wherein the discriminating of the range of the phase comprises:

identifying an increasing and/or decreasing pattern of the magnitude of the reflection coefficient according to a change in a reactive component of the sensing impedance;

determining whether a point representing the reflection coefficient is positioned in a upper half plane region or in a lower half plane region of a Smith chart according to an identification result; and determining whether the point representing the reflection coefficient is positioned in a left half plane region or in a right half plane region of the Smith chart by use of a phase region discriminant expressed in a following equation:

$$D = \frac{|\Gamma|_{load} - |\Gamma|_{min}}{|\Gamma|_{load}^2}$$

where $|\Gamma|_{load}$ denotes the magnitude of a reflection coefficient caused by a load impedance of the load before a change in the sensing impedance, and $|\Gamma|_{min}$ denotes a second reflection coefficient which is a minimum of magnitudes of the reflection coefficients after the change in the sensing impedance when a resistive component of the sensing impedance of the sensing impedance circuit is changed contiguously.

* * * * *